United States Patent
Wang et al.

(10) Patent No.: US 12,219,775 B2
(45) Date of Patent: Feb. 4, 2025

(54) SEMICONDUCTOR STRUCTURE AND METHOD OF FORMING THE SAME

(71) Applicant: Taiwan Semiconductor Manufacturing Company, Ltd., Hsinchu (TW)

(72) Inventors: Sheng-Chen Wang, Hsinchu (TW); Meng-Han Lin, Hsinchu (TW); Han-Jong Chia, Hsinchu (TW); Feng-Cheng Yang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 468 days.

(21) Appl. No.: 17/577,410

(22) Filed: Jan. 18, 2022

(65) Prior Publication Data
US 2023/0045420 A1 Feb. 9, 2023

Related U.S. Application Data

(60) Provisional application No. 63/230,050, filed on Aug. 5, 2021.

(51) Int. Cl.
| | |
|---|---|
| *H10B 51/20* | (2023.01) |
| *H01L 23/48* | (2006.01) |
| *H01L 23/522* | (2006.01) |
| *H10B 51/10* | (2023.01) |
| *H10B 51/40* | (2023.01) |

(52) U.S. Cl.
CPC ........... *H10B 51/20* (2023.02); *H01L 23/481* (2013.01); *H01L 23/5226* (2013.01); *H10B 51/10* (2023.02); *H10B 51/40* (2023.02)

(58) Field of Classification Search
CPC ........ H10B 51/20; H10B 51/10; H10B 51/40; H01L 23/481; H01L 23/5226
See application file for complete search history.

(56) References Cited

U.S. PATENT DOCUMENTS

| | | | | |
|---|---|---|---|---|
| 10,032,666 | B2* | 7/2018 | Shin | H10B 43/50 |
| 11,423,966 | B2* | 8/2022 | Lin | H10B 43/20 |
| 11,710,790 | B2* | 7/2023 | Chiang | G11C 11/223 |
| | | | | 257/295 |
| 11,856,785 | B2* | 12/2023 | Lin | H10B 51/30 |
| 12,002,534 | B2* | 6/2024 | Lin | H10B 51/00 |
| 2020/0098786 | A1* | 3/2020 | Park | H01L 23/481 |
| 2021/0020654 | A1* | 1/2021 | Oh | H01L 24/08 |
| 2021/0217759 | A1* | 7/2021 | Oh | H01L 23/5283 |
| 2021/0375933 | A1* | 12/2021 | Lu | H01L 21/02565 |
| 2021/0398568 | A1* | 12/2021 | Lin | H10B 51/20 |

(Continued)

*Primary Examiner* — Bac H Au
(74) *Attorney, Agent, or Firm* — JCIPRNET

(57) ABSTRACT

A semiconductor structure and method of forming the same are provided. The semiconductor structure includes a circuit structure, an interlayer structure and a memory structure. The circuit structure includes a substrate having semiconductor devices formed thereon; a dielectric structure disposed over the semiconductor devices; and an interconnect layer embedded in the dielectric structure and connected to the semiconductor devices. The interlayer structure is disposed over the circuit structure. The memory structure is disposed over the interlayer structure and physically separated from the circuit structure by the interlayer structure.

11 Claims, 31 Drawing Sheets

(56) References Cited

U.S. PATENT DOCUMENTS

| | | | | |
|---|---|---|---|---|
| 2022/0005830 A1* | 1/2022 | Wu | ............... | H01L 29/6684 |
| 2022/0223622 A1* | 7/2022 | Chien | ............ | G11C 11/2255 |
| 2023/0328997 A1* | 10/2023 | Lu | ............ | G11C 11/223 |
| | | | | 257/43 |

* cited by examiner

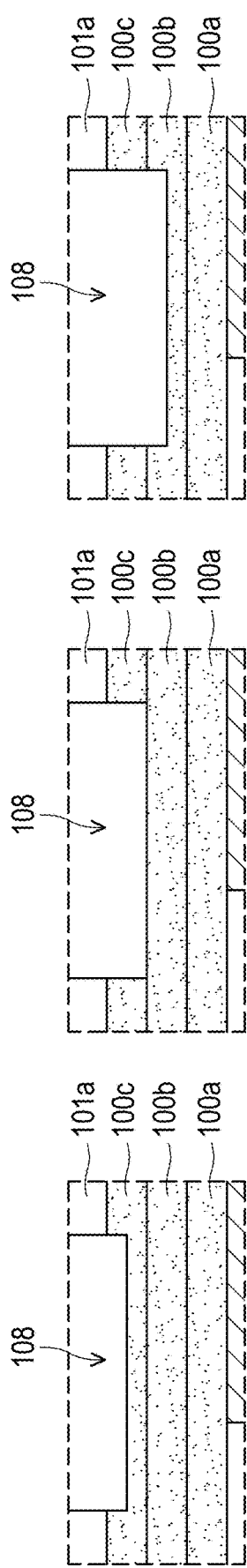
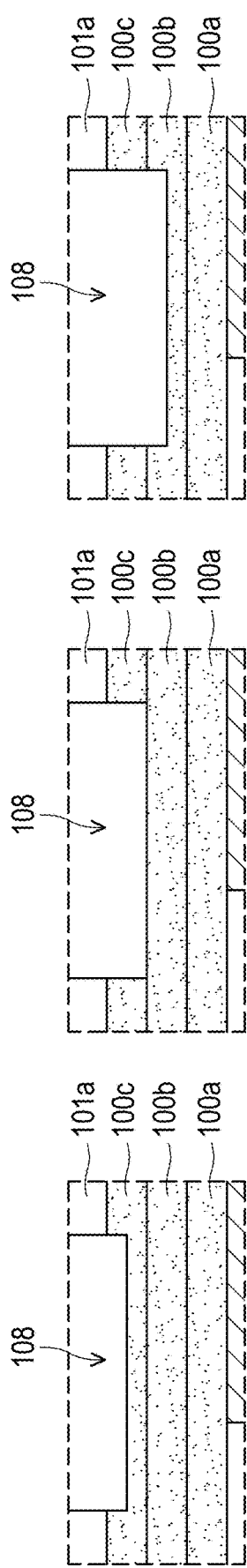
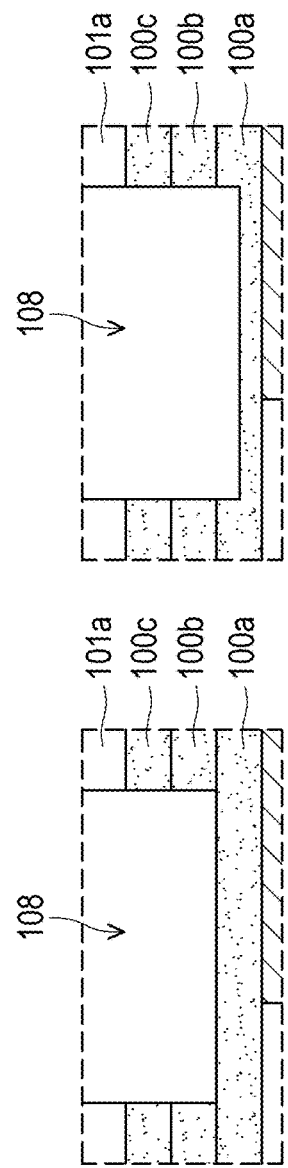

SEMICONDUCTOR STRUCTURE AND METHOD OF FORMING THE SAME

CROSS-REFERENCE TO RELATED APPLICATION

This application claims the priority benefit of U.S. provisional application Ser. No. 63/230,050, filed on Aug. 5, 2021. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
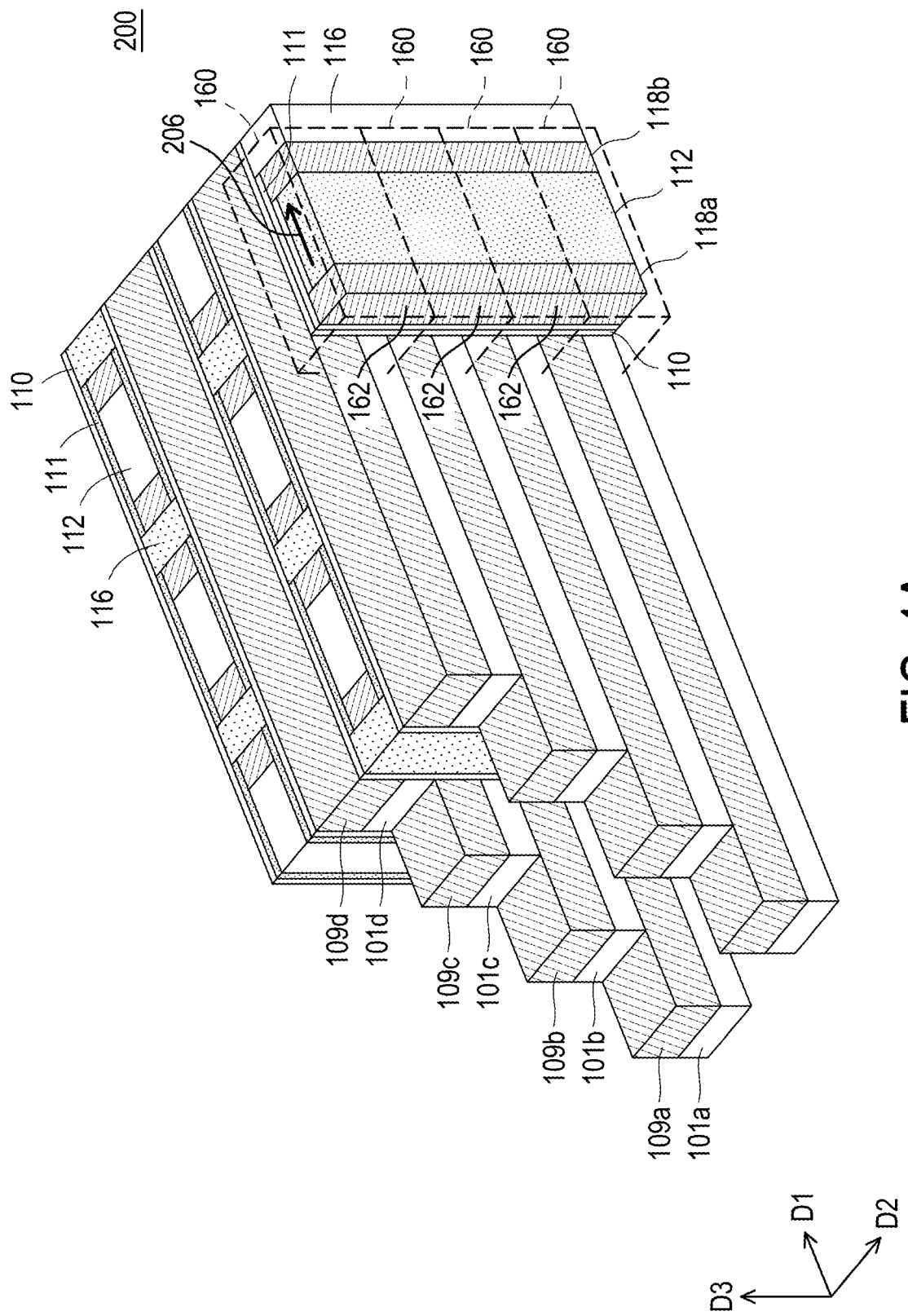
FIG. 1A illustrates a perspective view of an example of a memory structure according to some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments of the disclosure are directed to provide a semiconductor structure that integrates memory device and logic circuit in a three-dimensional (3D) structure. The logic circuit may be formed in front-end-of-line (FEOL) within a semiconductor die, while the memory device may be formed over the logic circuit in back-end-of-line (BEOL) within the semiconductor die. An interlayer structure is provided between the logic circuit and the memory device to provide isolation, and also serve as an etching stop structure and protection structure for protecting the underlying logic circuit from being damaged during fabrication of the memory device.

Figure 1B:
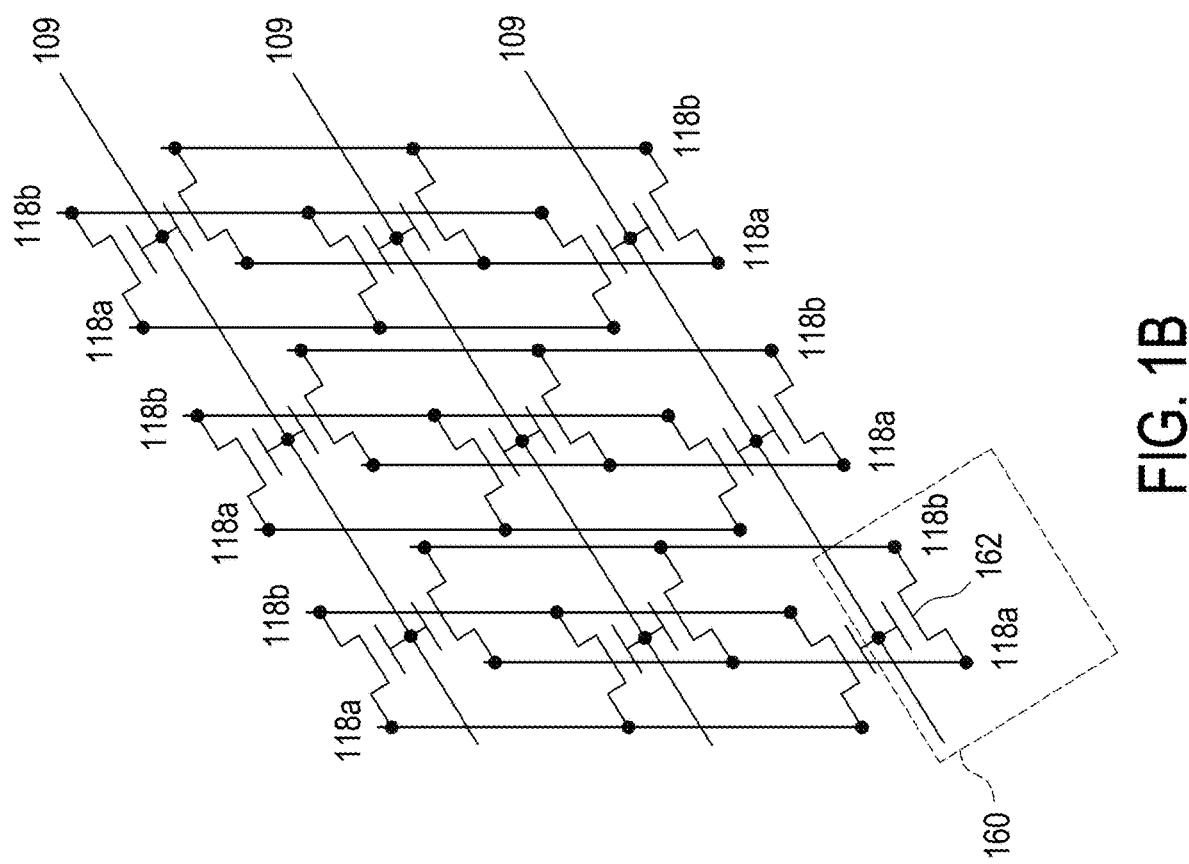
FIG. 1B illustrates a partial equivalent circuit diagram of the memory structure of FIG. 1A according to some embodiments of the disclosure.

FIG. 1A illustrates a perspective view of an example of a memory structure according to some embodiments of the disclosure. FIG. 1B illustrates a partial equivalent circuit diagram of the memory structure of FIG. 1A according to some embodiments of the disclosure.

Referring to FIG. 1A, in some embodiments, the memory structure 200 includes a plurality of memory cells 160, which may be arranged in arrays including rows and columns. The arrays of the memory cells 160 may be stacked vertically to provide a 3D memory array, thereby increasing device density. In some embodiments, the memory structure 200 may also be referred to as a memory array structure or a 3D memory structure. The memory structure 200 may be disposed in BEOL of a semiconductor die. For example, the memory array may be disposed in an interconnection structure of the semiconductor die, and above one or more active devices (e.g., transistors) formed on a semiconductor substrate. In some embodiments, the memory structure 200 may be disposed in a top tier of the interconnection structure, such as above all other interconnect layers in the semiconductor die. In some other embodiments, the memory structure 200 may be disposed in an intermediate tier of the interconnection structure, and the semiconductor die may include, for example, additional interconnect layers above and below the memory structure 200.

In some embodiments, the memory structure 200 may be a random-access memory (RAM), which may be volatile or non-volatile, such as ferroelectric random-access memory (FeRAM). In some embodiments, the memory structure 200 may be a flash memory, such as a NOR flash memory. However, the disclosure is not limited thereto, the memory structure 200 may be any suitable type of memory.

In some embodiments, the memory structure 200 includes a stack structure having a plurality of conductive lines 109a-109d and dielectric layers 101a-101d alternately stacked over underlying structure (not shown in FIG. 1A). The conductive lines 109a-109d may be collectively referred to as conductive lines 109, and the dielectric layers 101a-101d may be collectively referred to as dielectric layers 101. In each tier of the stack structure, the conductive lines 109 may extend in a direction D1 and are arranged along direction D2 that is substantially perpendicular to the direction D1. The stack structure may have a staircase structure such that lower conductive lines 109 are longer than and extend laterally past endpoints of upper conductive lines 109. In this manner, the conductive lines 109 may each have a protruding portion that is accessible from above the memory structure 200, and conductive contacts may be formed to land on the protruding portions of the conductive lines 109.

The memory structure 200 further includes multiple pairs of conductive pillars (or referred to as conductive lines) 118a and 118b. The conductive lines 118a and 118b may extend in a direction D3 that is substantially perpendicular to the directions D1 and D2. Dielectric layers 112 may be disposed between and isolate adjacent ones of the conductive pillars 118a and 118b. Pairs of the conductive pillars 118a and 118b are separated and isolated from each other by isolation structures 116 disposed therebetween.

Channel layers 111 are disposed between pairs of the conductive pillars 118a/118b and the corresponding conducive lines 109. The channel layers 111 are configured for providing channel region for transistors of the memory cells 160. Data storage layers 110 are disposed between the conductive lines 109 and the channel layers 111. The data storage layers 110 may include a ferroelectric material, and may also provide gate dielectrics for the transistors of the memory cells 160.

In some embodiments, the conductive lines 109 may serve as word lines, the conductive pillars 118a and 118b may serve as source lines and bit lines. For example, the conductive pillars 118a may serve as source lines, while the conductive pillars 118b may serve as bit lines, or vice versa. In some embodiments, pairs of the conductive pillars 118a and 118b along with corresponding intersecting conductive lines 109 define boundaries of memory cells 160. The memory cells 160 each include a transistor 162. A portion of the conductive line 109 serve as a gate electrode of the transistor 162, and corresponding portions of a pair of the conductive pillars 118a and 118b serve as source/drain regions of the transistor 162. A portion of the channel layer 111 disposed between the conductive pillars 118a/118b and the conductive line 109 serves as the channel region of the transistor 162. For example, when an appropriate voltage (e.g., higher than a respective threshold voltage (Vth) of a corresponding transistor 162) is applied through a corresponding conductive line 109, a region of the channel layer 111 that intersects the conductive line 109 may allow current to flow between the conductive pillars 118a and 118b (e.g., in the direction indicated by arrow 206).

The data storage layer 110 is interposed between the gate electrode and the channel region of the transistor 162. In some embodiments in which the data storage layer 110 include a ferroelectric layer, the ferroelectric layer 110 may be polarized in different polarization directions, and the polarization direction of the ferroelectric layer 110 may be changed by varying the voltage applied across the ferroelectric layer 110. The threshold voltage of the transistor 162 may vary as the polarization state of the ferroelectric layer 110 changes. For example, the ferroelectric layer 110 may be switched between a first polarization direction corresponding to a relative high threshold voltage and a second polarization direction corresponding to a relative low threshold voltage. The first polarization direction (e.g., high threshold voltage) and the second polarization direction (e.g., low threshold voltage) may respectively represent a first data state (e.g., "0") and a second data state (e.g., "1"), or vice versa.

In some embodiments, as shown in FIG. 1A and FIG. 1B, the gate of transistor 162 is electrically coupled to a corresponding word line, one of the source/drain regions (e.g., drain region) of the transistor 162 is electrically coupled to a corresponding bit line, and the other one of the source/drain region (e.g., source region) of the transistor 162 is electrically coupled to a respective source line. The word line may connect the gates of memory cells 160 arranged in a same horizontal column along the direction D1. The source line may connect the source regions of the memory cells 160 arranged in a same vertical column along the direction D3. The bit line may connect the drain regions of the memory cells 160 arranged in a same vertical column along the direction D3. In other words, the memory cells 160 in a same horizontal column of the memory structure 200 may share a common word line, while the memory cells 160 in a same vertical column of the memory structure 200 may share a common source line and a common bit line.

In some embodiments, during a write operation of a memory cell 160, a write voltage is applied across a portion of the data storage layer 110 corresponding to the memory cell 160. The write voltage may be applied, for example, by applying appropriate voltages to a corresponding conductive line 109 (e.g., the word line) and the corresponding conductive pillars 118a/118b (e.g., the bit line/source line). By applying the write voltage across the portion of the data storage layer 110, a polarization direction of the region of the data storage layer (e.g., ferroelectric layer) 110 may be changed. As a result, the corresponding threshold voltage of the corresponding transistor 162 may also be switched from a low threshold voltage to a high threshold voltage, or vice versa, and a digital value "0", or "1" may be stored in the memory cell 160.

During a read operation of the memory cell 160, a read voltage may be applied to the corresponding conductive line 109 (e.g., the world line/gate electrode). The read voltage applied may be between the low and high threshold voltages of the transistor 162. Depending on the polarization direction of the corresponding region of the data storage layer (e.g., ferroelectric layer) 110, the transistor 162 of the memory cell 160 may or may not be turned on. As a result, the corresponding conductive line 118a may or may not be discharged through the conductive line 118b (e.g., a corresponding source line that is coupled to ground), and the digital value stored in the memory cell 160 may be determined.

Figure 9A:
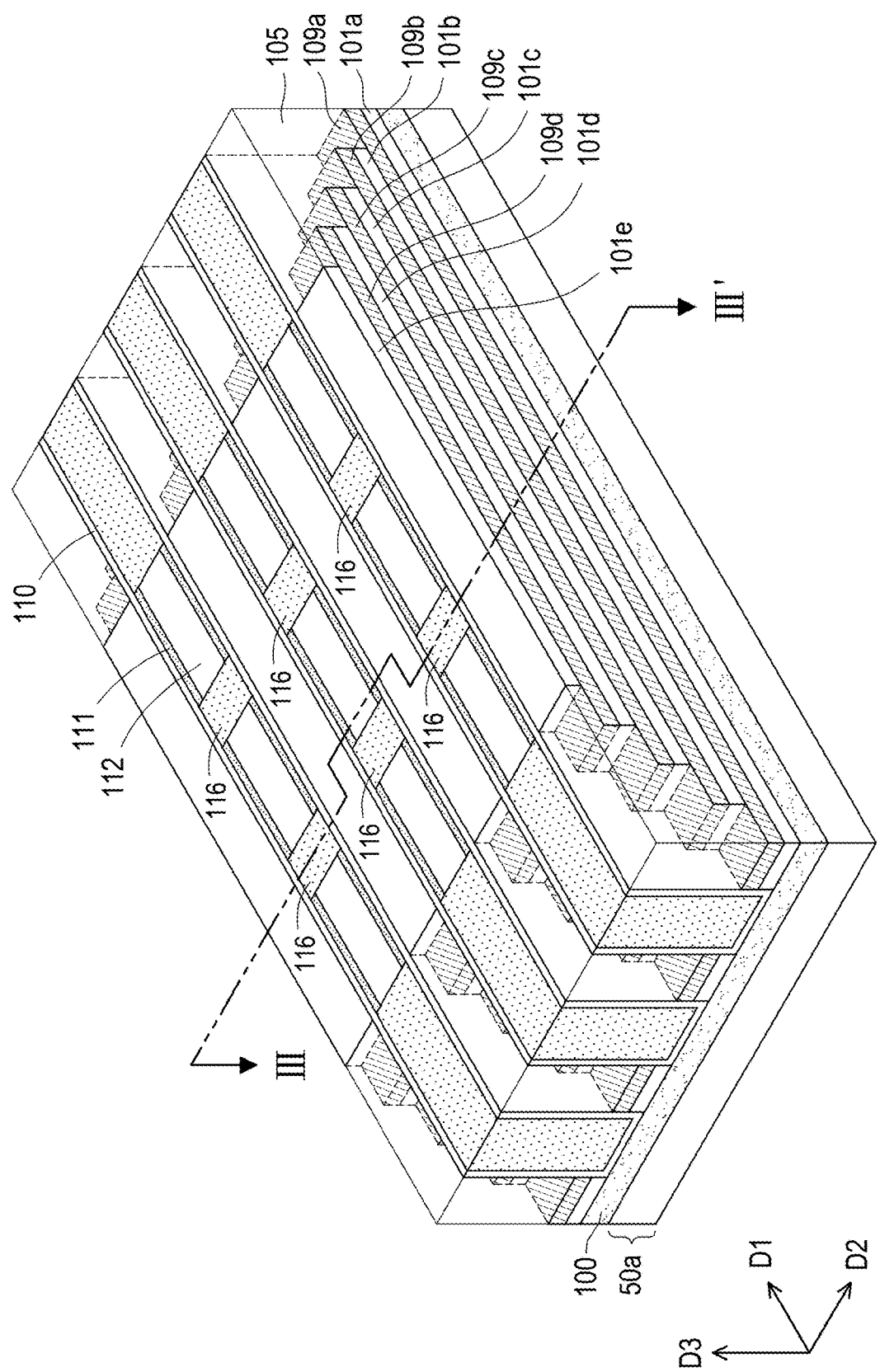
Figure 9B:
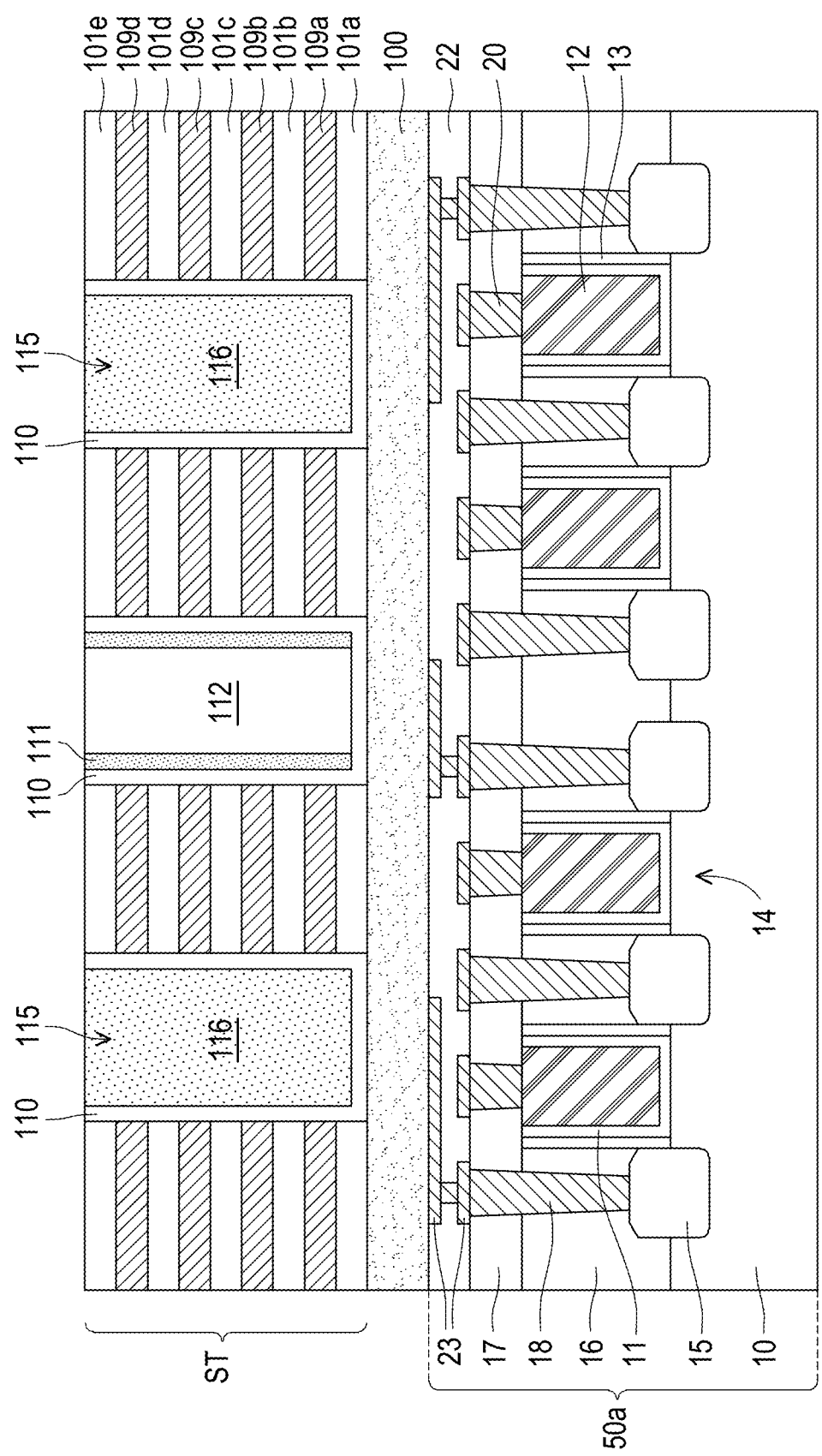
Figure 9C:
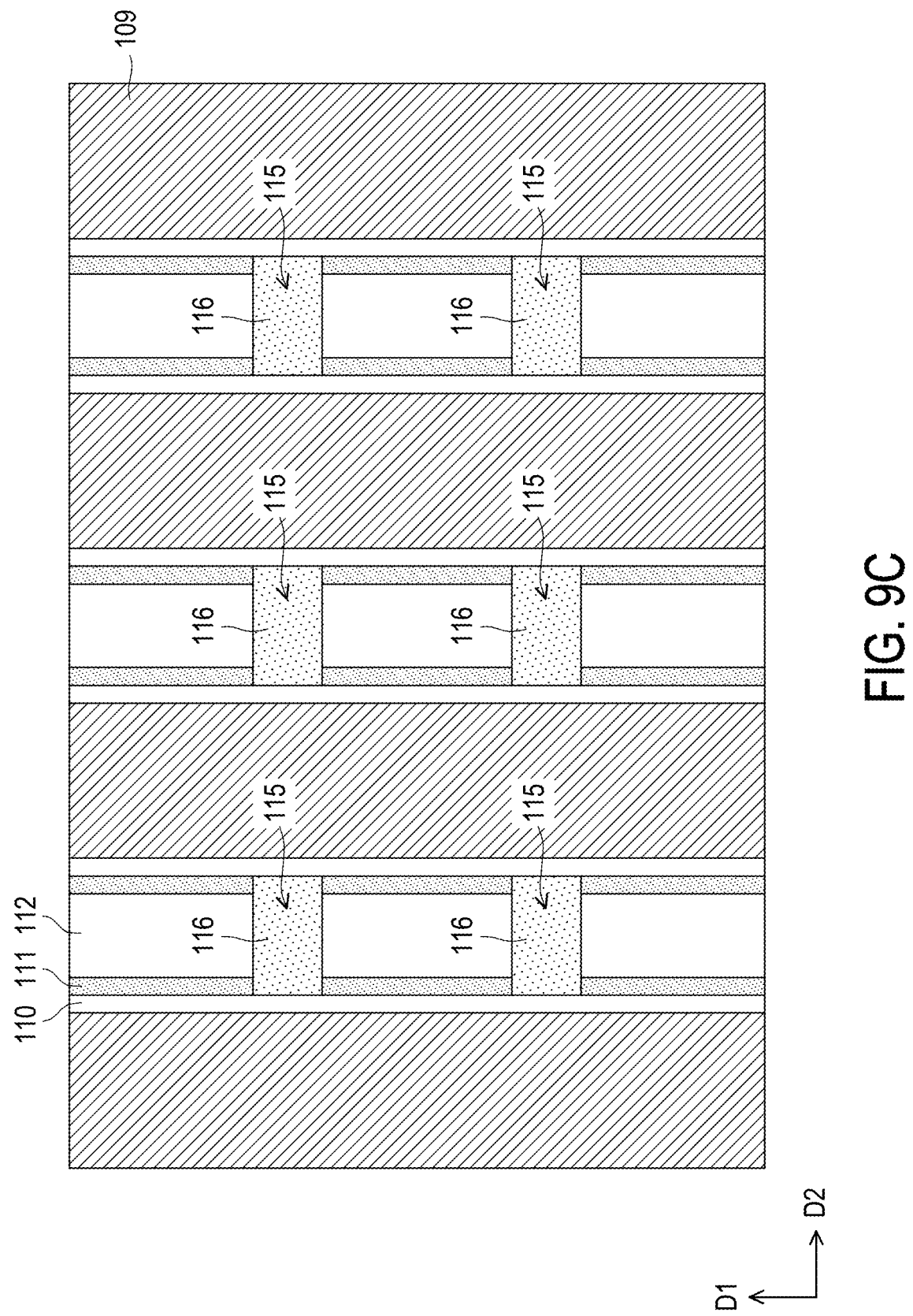
Figure 10A:
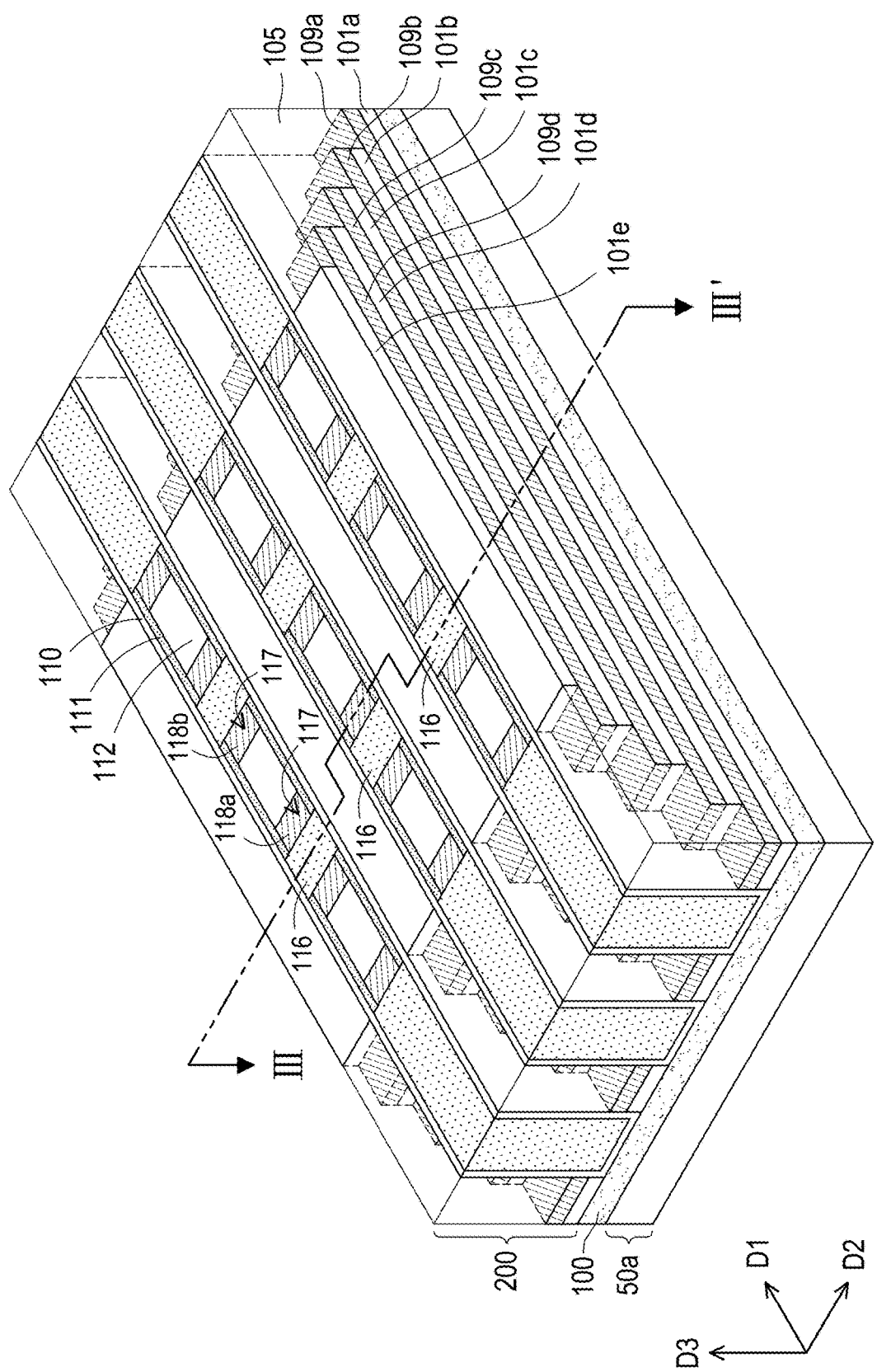
Figure 10B:
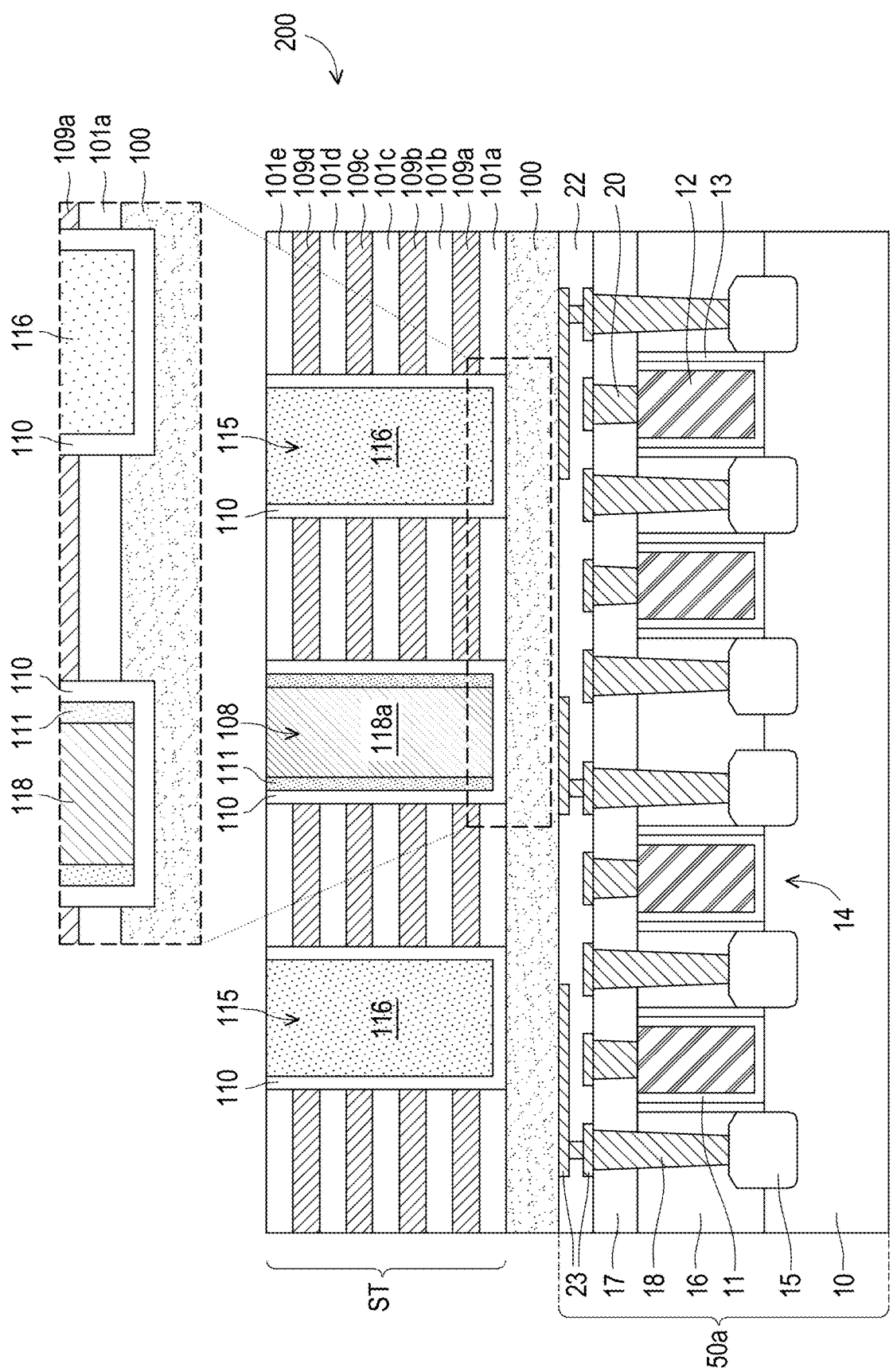
Figure 10C:
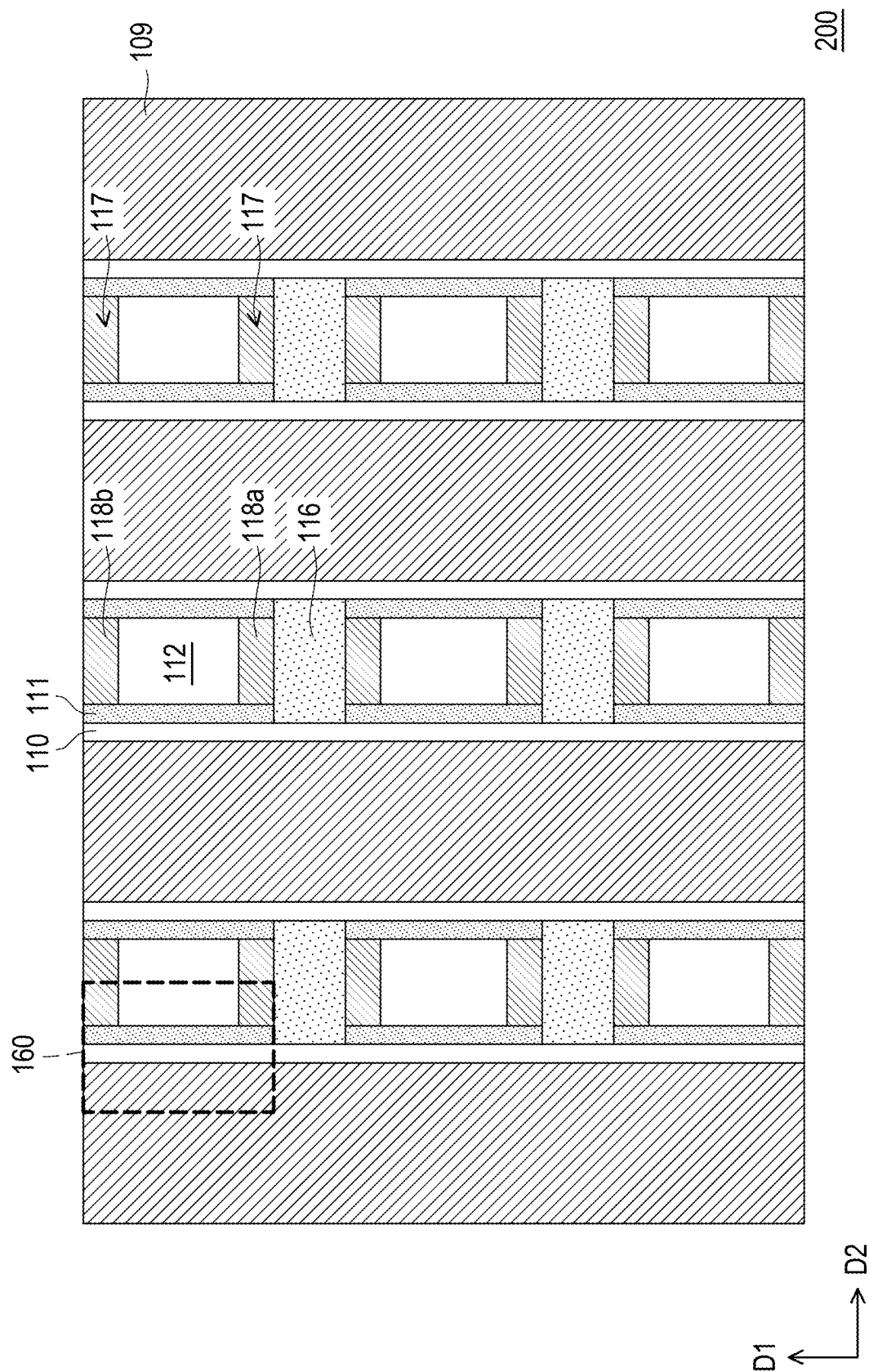
Figure 11A:
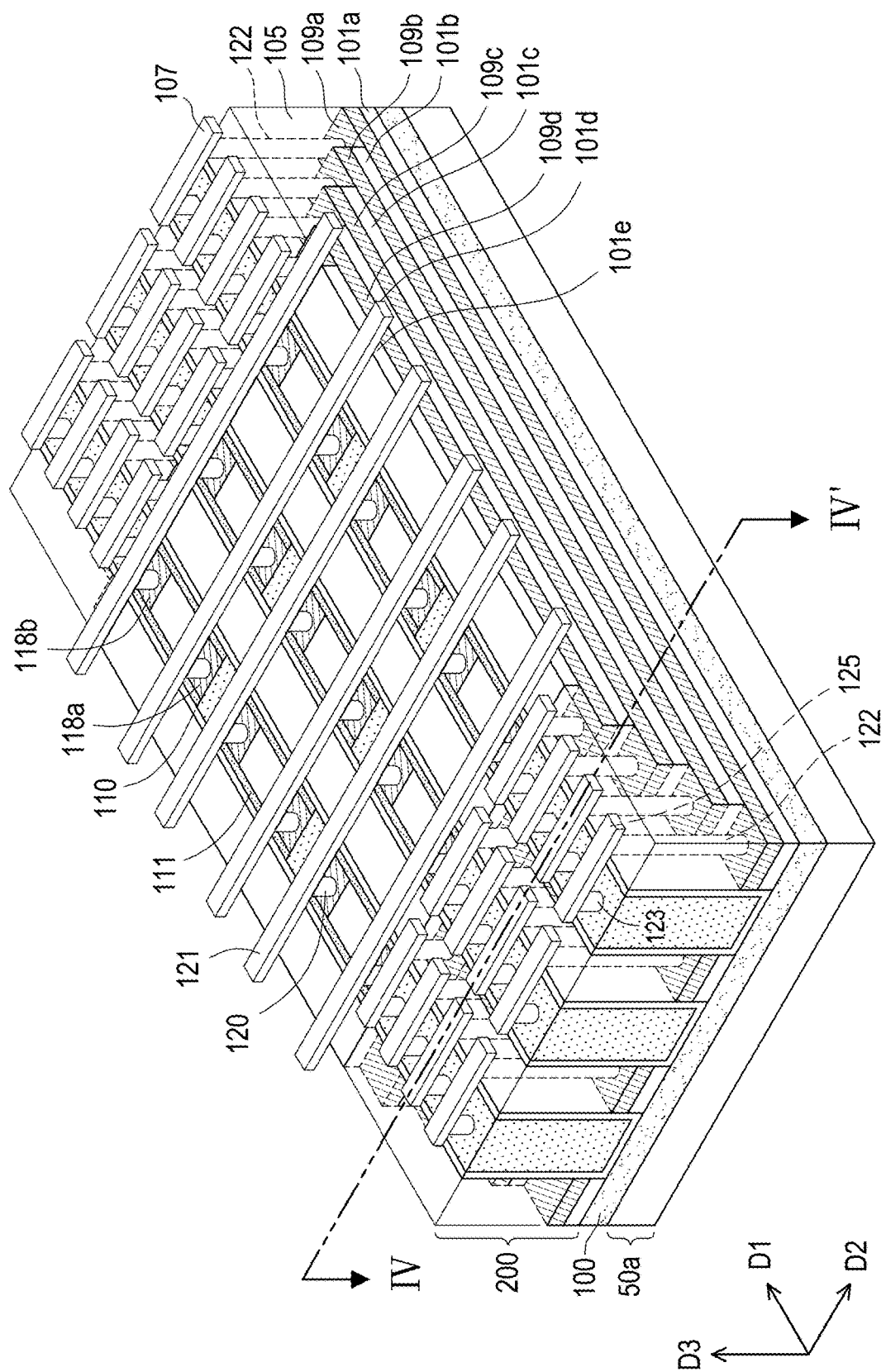
Figure 11B:
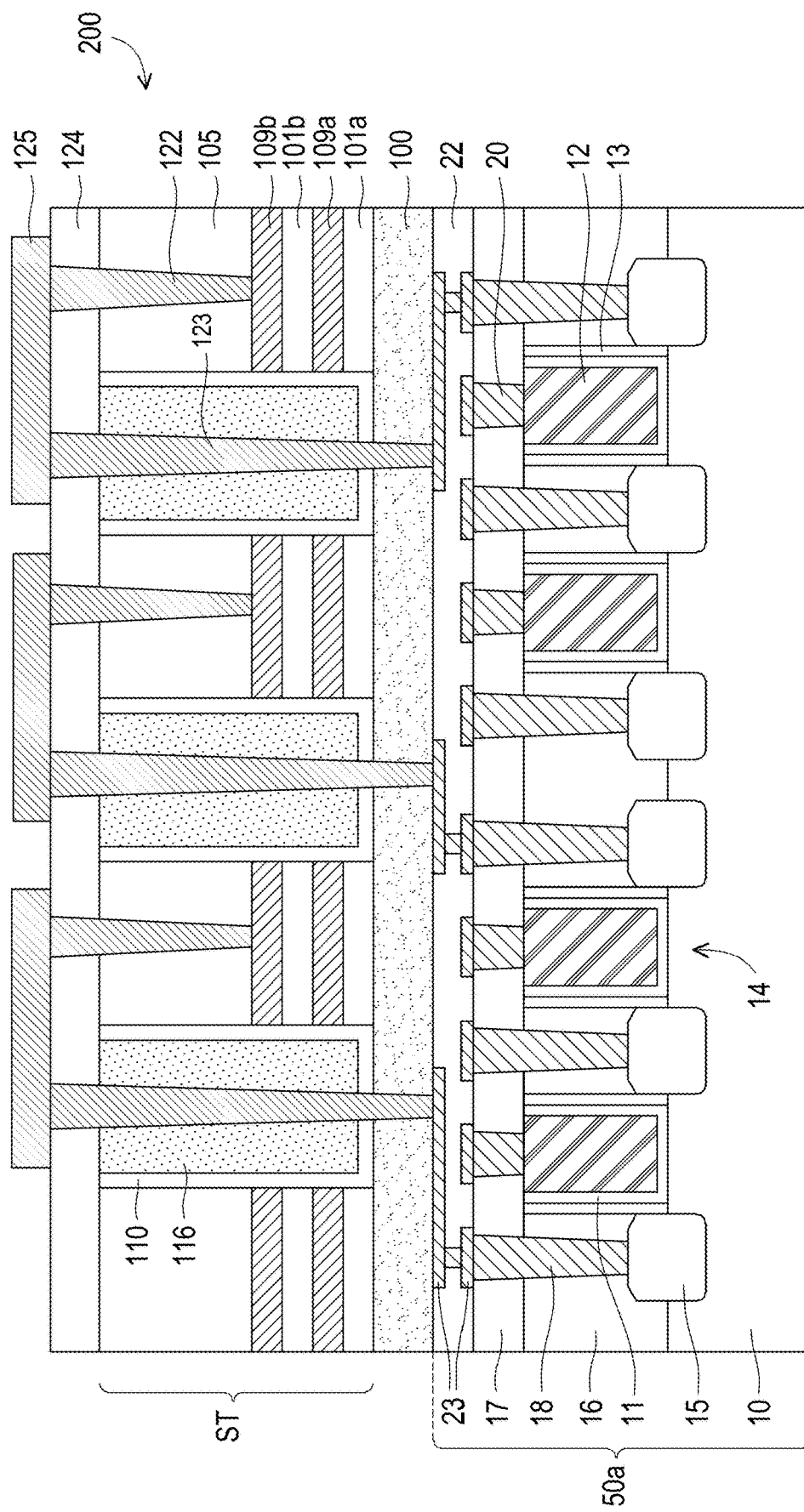

FIG. 2A to FIG. 11B are various views illustrating a method of forming a memory structure integrating with a logic circuit in a 3D structure, according to some embodiments of the disclosure. FIG. 2A to FIG. 11A are illustrated in perspective views. For the sake of brevity, the structure of underlying logic circuit is not specifically shown in perspective views FIG. 2A to FIG. 11A. FIGS. 2B, 5B, 6B, 7B illustrate cross-sectional views taken along line I-I' of FIGS. 2A, 5A, 6A, 7A, respectively. FIGS. 3B, 4B illustrate cross-sectional views taken along line II-II' of FIGS. 3A, 4A, respectively. FIGS. 8B, 9B, 10B illustrate cross-sectional views taken along III-III' of FIG. 8A, 9A, 10A, respectively. FIGS. 8C, 9C, 10C illustrate plan views of FIGS. 8A, 9A, 10A along a plane including top surfaces of one tier of the conductive lines 109, respectively. FIG. 11B illustrate a cross-sectional view taken along line IV-IV' of FIG. 11A.

Figure 2A:
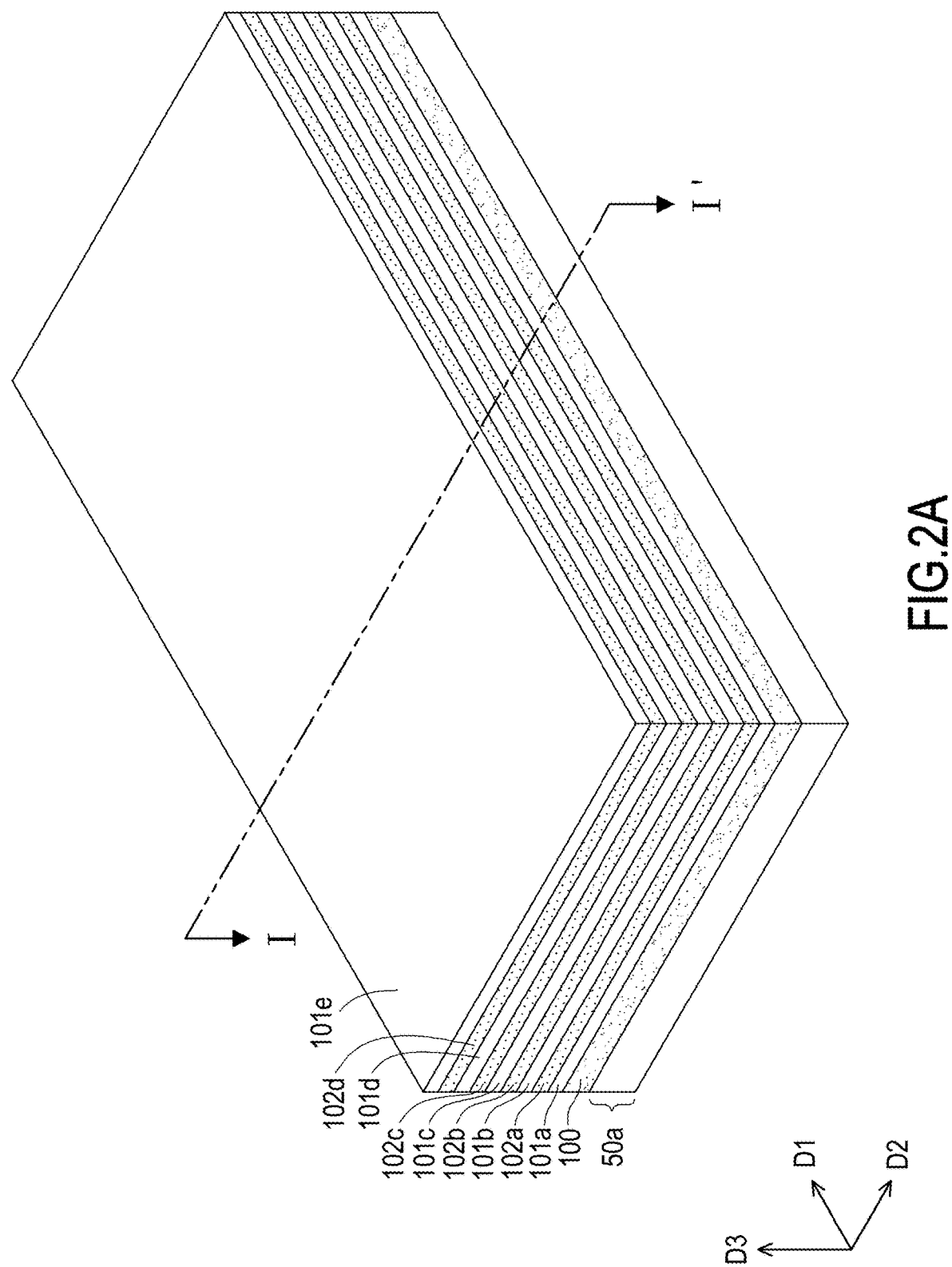
FIG. 2A through FIG. 11B are various views illustrating a method of forming a semiconductor structure including a memory structure that is integrated with a logic circuit in a three-dimensional (3D) structure according to some embodiments of the disclosure.
Figure 2B:
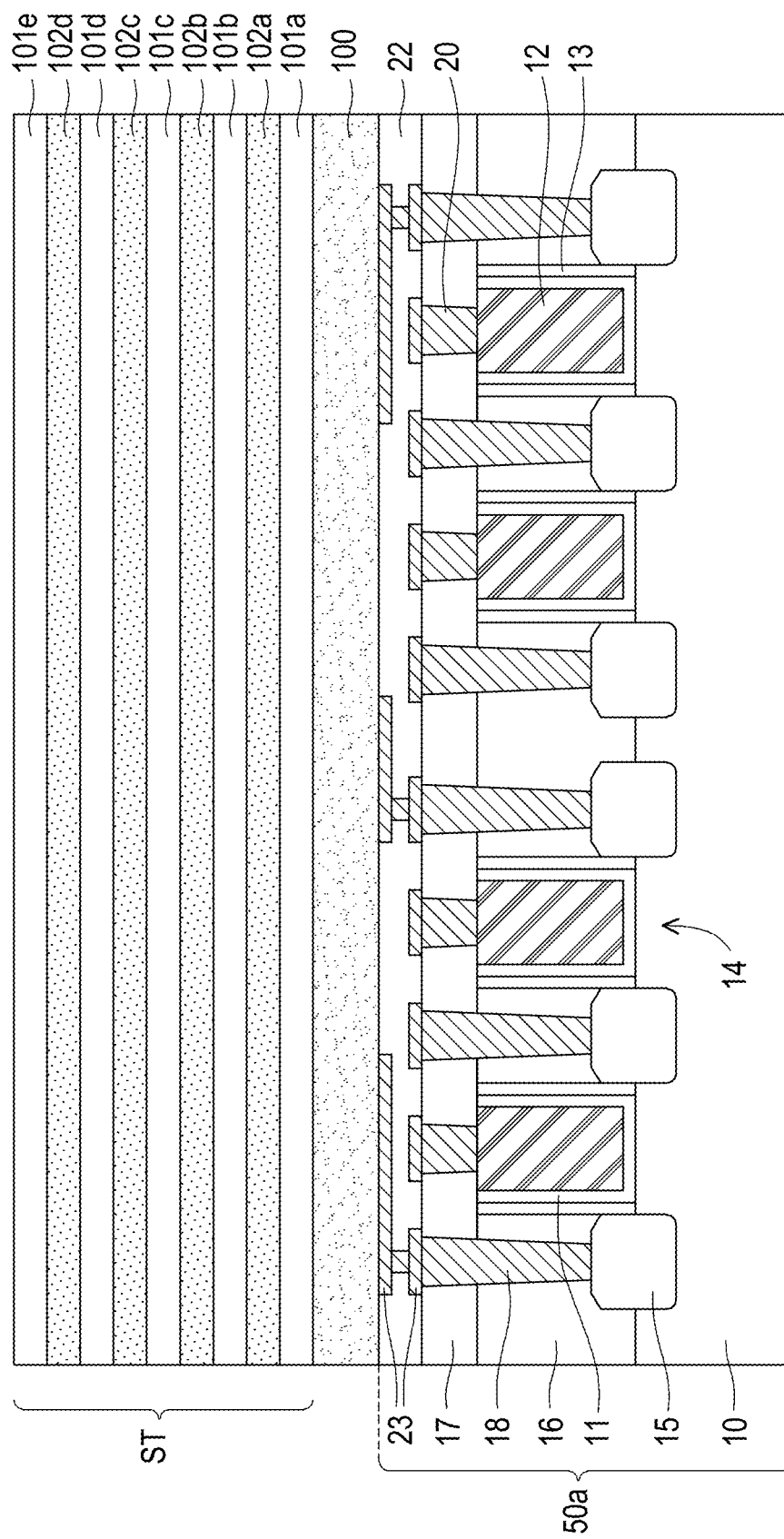

Referring to FIG. 2A and FIG. 2B, a substrate 10 is provided. The substrate 10 may be a semiconductor substrate, such as a bulk semiconductor substrate, a semiconductor-on-insulator (SOI) substrate, or the like, which may be doped (e.g., with a p-type or an n-type dopant) or undoped. The substrate 10 may be a wafer, such as a silicon wafer. Generally, a SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 10 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. In some embodiments, various devices may be formed on and/or in the substrate 10. The devices may include active devices (e.g., transistors, diodes, or the like), passive devices (e.g., capacitors, resistors, or the like), or combinations thereof.

FIG. 2B illustrates integrated circuits that may be formed over the substrate 10. The integrated circuits may include transistors 14 (e.g., complementary metal-oxide-semiconductor (CMOS) transistors) disposed on the substrate 10. For example, the transistors may include fin type field-effect transistors (FinFETs), nanostructure (e.g., nanosheet, nanowire, gate-all-around (GAA), or the like) FETS (nanoFETs), planar MOSFETs, the like, or combinations thereof.

In some embodiments, the transistors 14 may include gate dielectric layers 11 formed over the substrate 10 and gate electrodes 12 formed over the gate dielectric layers 11. Gate spacers 13 are formed on sidewalls of the gate dielectric layer 11 and the gate electrode 12. Source/drain regions 15 are disposed in/on the substrate 10 and on opposite sides of the gate structure including the gate dielectric layer 11, the gate electrode 12 and the gate spacers 13.

In some embodiment, an interconnection structure including a dielectric structure and conductive features are formed on the devices (e.g., transistors) over the substrate 10. The conductive features are embedded in the dielectric structure and electrically connected to the transistors to form a functional circuit. In some embodiments, the dielectric structure includes inter-layer dielectric layers (ILDs) and inter-metal dielectric layers (IMDs). The conductive features (or referred to as interconnect wirings) may include multiple tiers of conductive lines, conductive vias, and conductive contacts. The conductive contacts may be formed in the ILDs to electrically connect the conductive lines to the devices; the conductive vias may be formed in the IMDs to electrically connect the conductive lines in different tiers.

For example, a dielectric layer 16 is disposed on the substrate 10 and laterally aside the gate structures of the transistors 104, and a dielectric layer 17 is disposed on the dielectric layer 16 and the gate structures. The dielectric layer 16 may also be referred to as a first ILD, and the dielectric layer 17 may also be referred to as a second ILD. Source/drain contacts 18 penetrate through the dielectric layers 17 and 16 to electrically couple to the source/drain regions 15. Gate contacts 20 penetrate through the dielectric layer 17 to electrically couple to the gate electrodes 12. One or more dielectric layer (or referred to as IMD) 22 may be formed over the dielectric layer 17, and conductive features 23 are formed in the one or more dielectric layers 22, for example. The conductive features 23 may include multiple layers of conductive lines and conductive vias interconnected with each other. The conductive features 23 may also be referred to as interconnect layers. It is noted that, the number of layers of the dielectric layer 22 and conductive features 23 shown in FIG. 1A is merely for illustration, and the disclosure is not limited thereto. The materials of the dielectric layers 16, 17, 22 may include silicon oxide, silicon nitride, silicon oxynitride, undoped silicate glass (USG), phosphosilicate glass (PSG), borosilicate glass (BSG), boron-doped phosphosilicate glass (BPSG), the like or combinations thereof. The contacts 18, 20 and the conductive features 23 may include suitable conductive materials, such as metal, metal alloy or a combination thereof. For example, the conductive material may include tungsten (W), copper (Cu), copper alloys, aluminum (Al), aluminum alloys, or combinations thereof.

The conductive features 23 may be electrically connected to the gate contacts 20 and the source/drain contacts 18 of the transistors 14 to form functional circuits, such as a logic circuit. Alternatively, or additionally, the functional circuits may include memory circuits, sense amplifiers, controllers, input/output circuits, image sensor circuits, the like, or combinations thereof. Although FIG. 2B discusses transistors formed over the substrate 10, other active devices (e.g., diodes or the like) and/or passive devices (e.g., capacitors, resistors, or the like) may also be formed as parts of the functional circuits.

In some embodiments, the substrate 10, the transistors 14, and a portion of the interconnection structure including the dielectric layers 16, 17, and 22, contacts 18, 20 and conductive features 23 constitute an underlying structure 50a. The underlying structure 50a may be a CMOS under array, and may be a logic circuit. The underlying structure 50a may also be referred to as a circuit structure or a logic circuit structure.

Still referring to FIG. 2A and FIG. 2B, in some embodiments, an interlayer structure 100 is formed over the underlying structure 50a. The interlayer structure 100 may be a single-layer structure or a multi-layer structure. The material of the interlayer structure 100 may include silicon oxide (e.g., $SiO_2$), silicon nitride (SiN), silicon carbide (SiC), silicon oxycarbide (SiOC), SiOCN, SiCN, low-K dielectric material, or combinations thereof. In some embodiments, the low-K dielectric material may include a low-k dielectric material with a dielectric constant lower than about 4, or extreme low-k (ELK) dielectric material with a dielectric constant lower than about 2.5. In some embodiments, the low-k material includes a polymer-based material, such as benzocyclobutene (BCB), FLARE®, or SILK®; or a silicon dioxide-based material, such as hydrogen silsesquioxane (HSQ) or SiOF. In some embodiments, the interlayer structure 100 is formed by a suitable deposition process, such as, chemical vapor deposition (CVD), atomic layer deposition (ALD), plasma enhanced CVD (PECVD), or the like. In some embodiments, after the interlayer structure 100 is deposited, a planarization process, such as a chemical mechanical polishing (CMP) process may be performed to planarize the top surface of the interlayer structure 100, such that the interlayer structure 100 has a substantially flat top surface to facilitate the subsequent formation of the stacked structure on the interlayer structure 100.

In some embodiments, the material of the interlayer structure 100 may be different from the material of underlying dielectric layer 22. The bottom surface of the interlayer structure 100 may be in physical contact with both the conductive features (e.g., conductive lines) 23 and the dielectric layer 22, but the disclosure is not limited thereto. In some alternative embodiments, portions of the dielectric layer 22 or additional dielectric layer may be disposed between the bottom surface of the interlayer structure 100 and the topmost surface of the conductive features 23, such that the bottom surface of the interlayer structure 100 is not in direct contact with the conductive features 23.

In some embodiments, the interlayer structure 100 is used as an isolation structure disposed between subsequent formed overlying memory structure and the underlying circuit structure 50a. The interlayer structure 100 also serve as an etching stop structure and a protection structure for protecting the underlying circuit structure 50a from being damaged by etching processes utilized during the formation of the overlying memory structure.

Still referring to FIG. 2A and FIG. 2B, a stack structure ST is formed over the interlayer structure 100. The stack structure ST may include a plurality of dielectric layers 101 and sacrificial layers 102 alternately stacked over the interlayer structure 100. For example, dielectric layers 101a-101e and sacrificial layers 102a-102d may be included in the stack structure ST. The dielectric layers 101a-101e may be collectively referred to as dielectric layers 101, and the sacrificial layers 102a-102d may be collectively referred to as sacrificial layers 102. It is noted that, the numbers of the dielectric layers 101 and the sacrificial layers 102 shown in the figures are merely for illustration, and the disclosure is not limited thereto.

In some embodiments, the dielectric layers 101 include suitable dielectric materials, such as silicon oxide, silicon nitride, silicon oxynitride, the like, or combinations thereof. The sacrificial layer 102 may be patterned and replaced in subsequent steps to define conductive features (e.g., word lines). The sacrificial layer 102 may include a dielectric material, such as silicon oxide, silicon nitride, silicon oxynitride, the like, or combinations thereof. In the embodiments, the sacrificial layer 102 and the dielectric layers 101 are formed of different materials, and the materials of the dielectric layers 101 are different from the material of the interlayer structure 100. In some embodiments, the materials of the sacrificial layers 102 are also different from the material of the interlayer structure 100. For example, the dielectric layers 101 include silicon oxide, while the sacrificial layer 102 includes silicon nitride. The dielectric layers 101 and the sacrificial layers 102 may be each formed using, for example, chemical vapor deposition (CVD), atomic layer deposition (ALD), plasma enhanced CVD (PECVD), or the like.

Figure 2C:
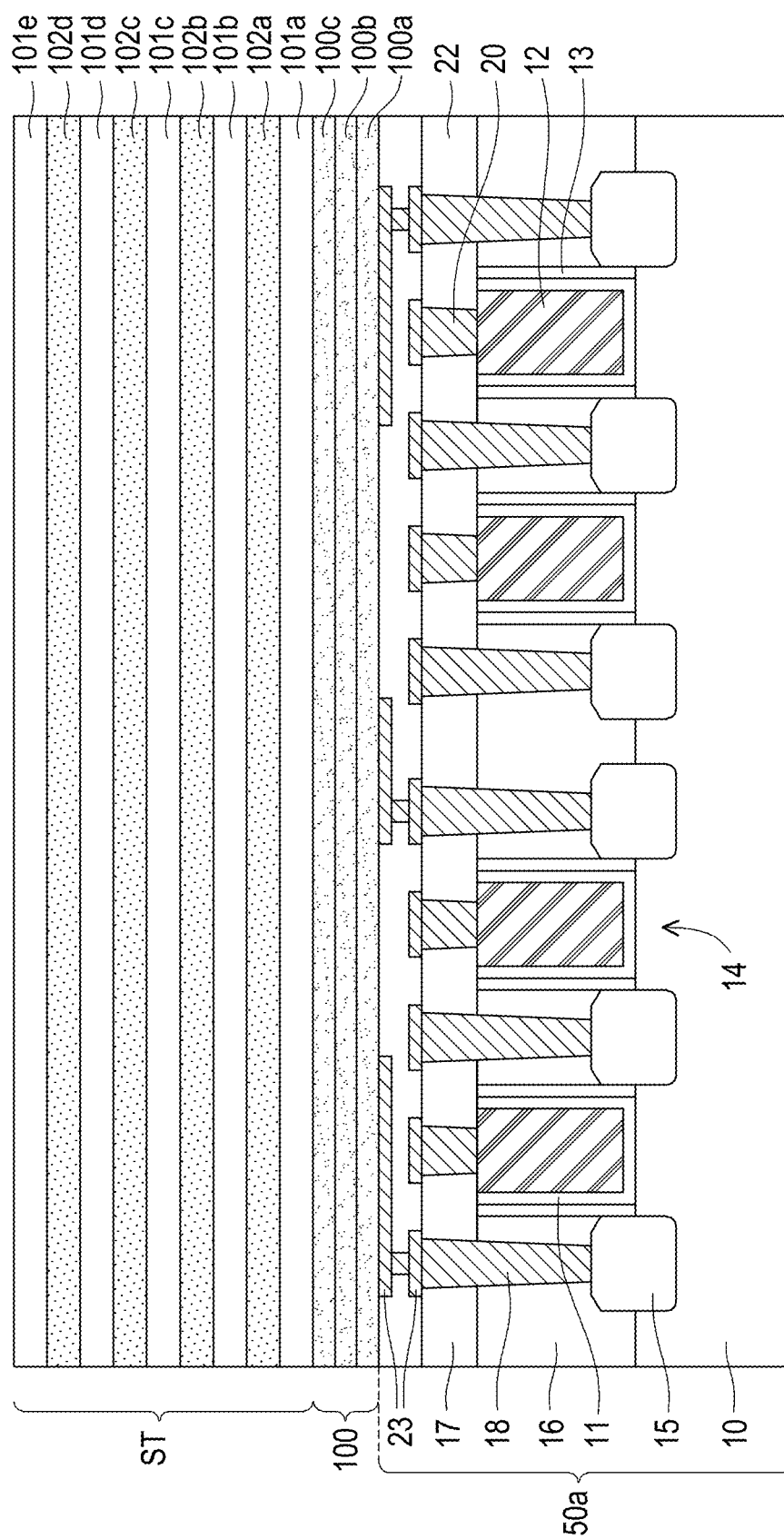

FIG. 2C illustrates an alternative embodiment of FIG. 2B. Referring to FIG. 2C, in some embodiments, the interlayer structure 100 is a multi-layer structure and may include a plurality of interlayers. For example, the interlayer structure 100 may include a first interlayer 100a, a second interlayer 100b, and a third interlayer 100c stacked over the underlying circuit structure 50a. It is noted that, the number of the interlayers included in the interlayer structure 100 shown in the figures is merely for illustration, and the disclosure is not limited thereto. More or less interlayers may be included in the interlayer structure 100. The materials of the interlayers 100a-100c are selected from the candidate material described above with respect to the interlayer structure 100. The thicknesses of the interlayers 100a-100c may be the same or different. In some embodiments, different materials may be applied to form the interlayers 100a-100c, so as to provide better control of subsequent etching process and better protection for the underlying circuit structure.

In some embodiments, the materials of the interlayers 100a-100c may be selected, such that the etching selectivity ratios of the overlying stack structure ST to the interlayers 100a-100c are increased from bottom to top. For example, the etching selectivity ratio of the stack structure ST to the interlayer 100c may be higher than the etching selectivity ratio of the stack structure ST to the interlayer 100b, and the etching selectivity ratio of the stack structure ST to the interlayer 100b may be higher than the etching selectivity ratio of the stack structure ST to the interlayer 100a. In other words, the highest etching selectivity ratio of the stack structure ST to the interlayer structure may be existed between the stack structure ST and the topmost interlayer (e.g., the interlayer 100c). However, the disclosure is not limited thereto.

In some other embodiments, the materials of the interlayers 100a-100c may be selected, such that the etching selectivity ratios of the overlying stack structure ST to the interlayers 100a-100c are increased from top to bottom. For example, the etching selectivity ratio of the overlying stack structure ST to the interlayer 100a is higher than the etching selectivity ratio of the overlying stack structure ST to the interlayer 100b, and the etching selectivity ratio of the stack structure ST to the interlayer 100b is higher than the etching selectivity ratio of the stack structure ST to the interlayer 100c. In other words, the highest etching selectivity ratio of the stack structure ST to the interlayer structure 100 may be existed between the stack structure ST and the bottommost interlayer (e.g., the interlayer 100a). In yet another embodiment, the highest etching selectivity ratio of the stack structure ST to the interlayer structure 100 may be configured as between the stack structure ST and a middle interlayer (e.g., the second interlayer 100b). For example, the etching selectivity ratio of the stack structure ST to the interlayer 100b may be higher than the etching selectivity ratio of the stack structure ST to the interlayer 100c and the etching selectivity ratio of the stack structure ST to the interlayer 100a, and the etching selectivity ratio of the stack structure ST to the interlayer 100a may be higher or lower than the etching selectivity ratio of the stack structure ST to the interlayer 100c.

Figure 3A:
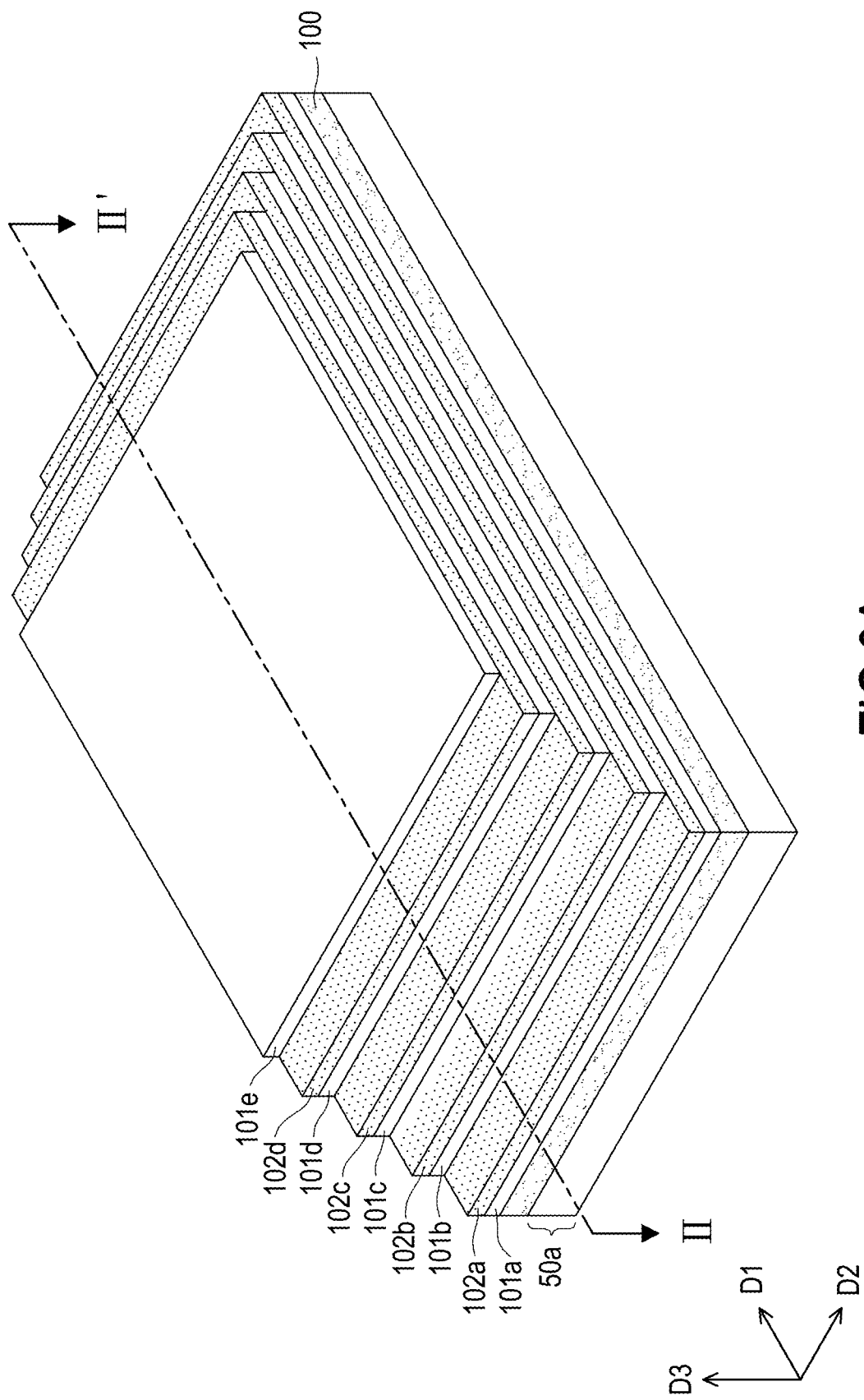
Figure 3B:
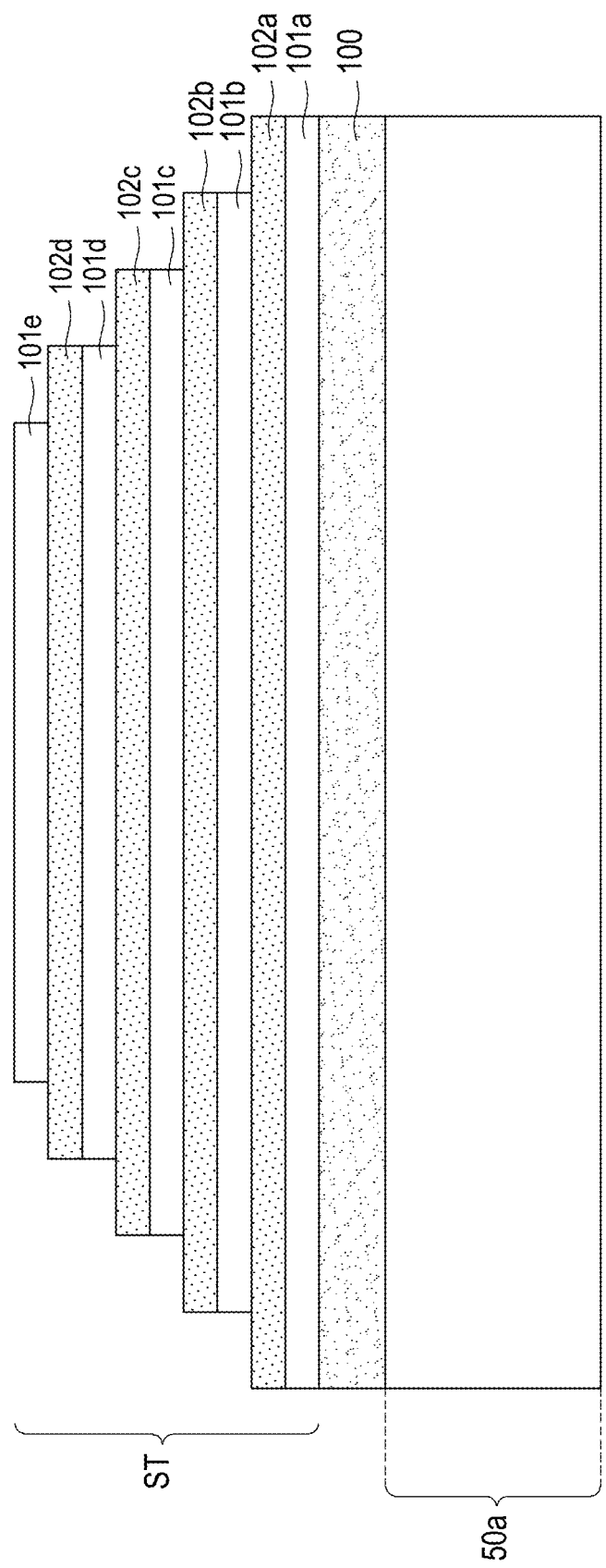

Referring to FIG. 3A and FIG. 3B, in some embodiments, the stack structure ST is patterned to form a staircase structure, such that portions of top surfaces of the sacrificial layers 102a-102d are exposed. For example, the dielectric layer 101a and the sacrificial layer 102a laterally protrude from the dielectric layer 101b and the sacrificial layer 102b; the dielectric layer 101b and the sacrificial layer 102b laterally protrude from the dielectric layer 101c and the sacrificial layer 102c; the dielectric layer 101c and the sacrificial layer 102c laterally protrude from the dielectric layer 101d and the sacrificial layer 102d; and the dielectric layer 101d and the sacrificial layer 102d laterally protrude from the dielectric layer 101e. It is noted that, the structure of the circuit structure 50a is not specifically shown in FIG. 3B, for the sake of brevity. In some embodiments, the formation of the staircase structure may include forming a patterned mask layer (e.g., patterned photoresist) on the stack structure ST. Etching process is performed on the top dielectric layer 101e and sacrificial layer 102d using the patterned mask layer as an etching mask. Thereafter, trimming process performed on the patterned mask layer, and etching process performed on the dielectric layers 101 and/or sacrificial layers 102 of stack structure ST using the trimmed mask layer as an etching mask are repeated until the staircase structure is formed. However, the disclosure is not limited thereto, other suitable processes may also be utilized for forming the staircase structure.

Figure 4A:
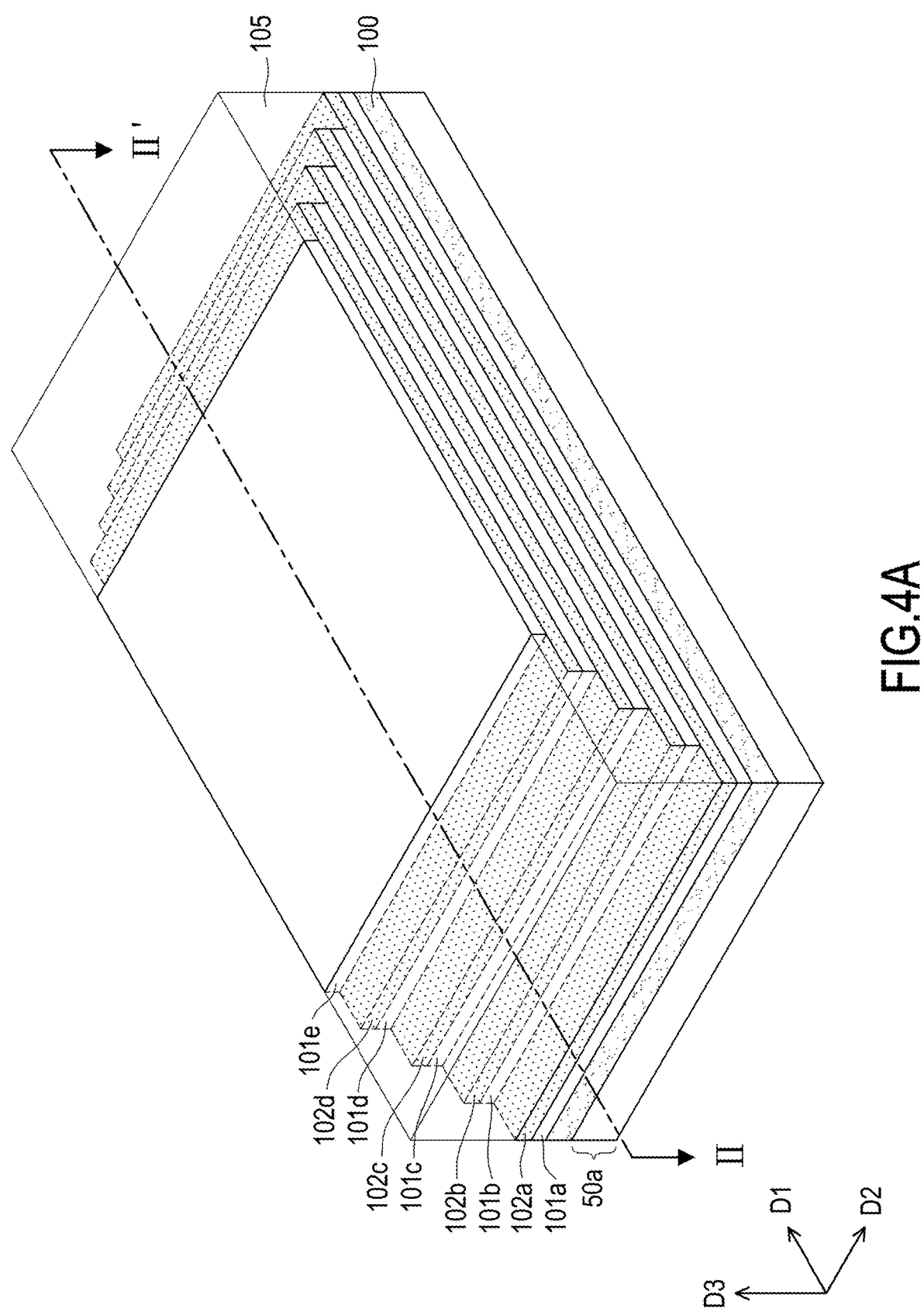
Figure 4B:
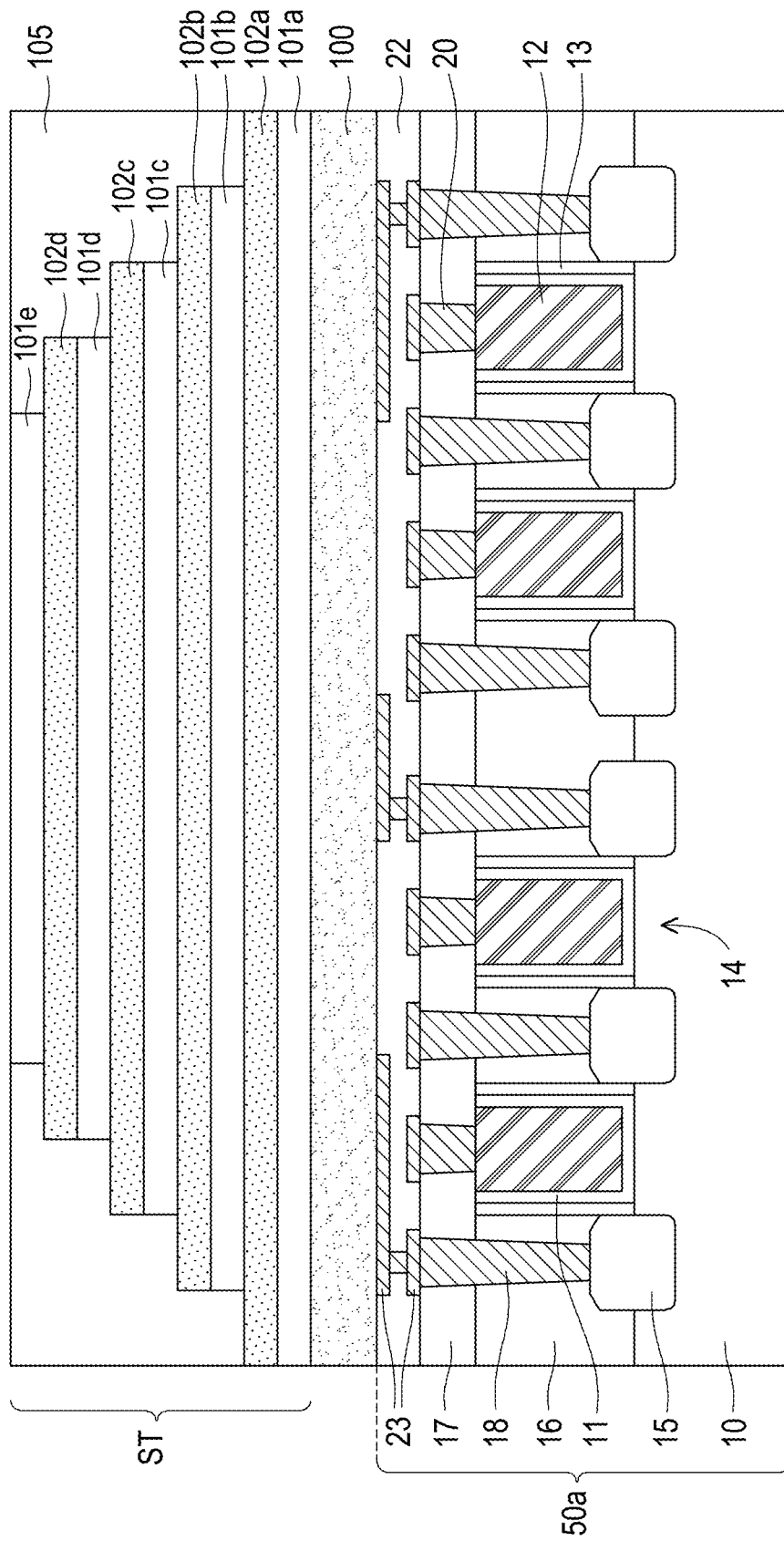

Referring to FIG. 4A and FIG. 4B, in some embodiments, a dielectric layer 105 is formed on the stack structure ST to cover the staircase region on edge of the stack structure ST. The dielectric layer 105 extends along sidewalls of the dielectric layers 101 and the sacrificial layers 102, and cover the top surfaces of the sacrificial layers 102. The material of the dielectric layer 105 may include an oxide (e.g., silicon oxide or the like), a nitride (e.g., silicon nitride or the like), phospho-silicate glass (PSG), boro-silicate glass (BSG), boron-doped phospho-silicate glass (BPSG), undoped silicate glass (USG), or the like, or combinations thereof. In some embodiments, the dielectric layer 105 may be formed by forming a dielectric material over the stack structure ST through a suitable deposition process, such as CVD, PECVD, flowable CVD (FCVD), or the like. The dielectric material covers the top surfaces and sidewalls of the stack structure ST. Thereafter, a planarization process, such as a CMP process, may be performed to remove excess portions of the dielectric material over the topmost surface of the stack structure ST (e.g., the top surface of the dielectric layer 101e). In some embodiments, the top surface of the dielectric layer 105 is substantially level with the topmost surface of the stack structure ST.

Figure 5A:
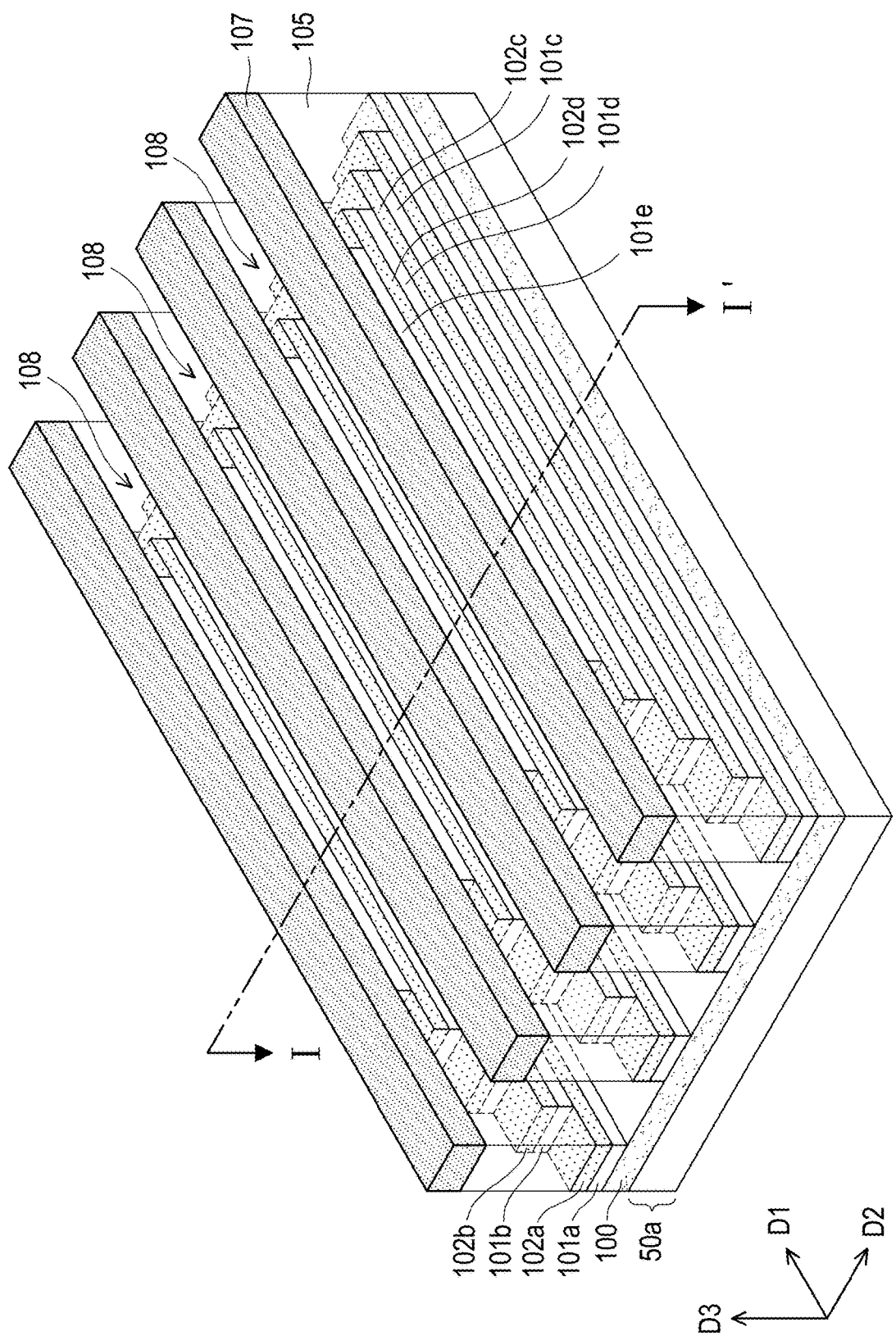
Figure 5B:
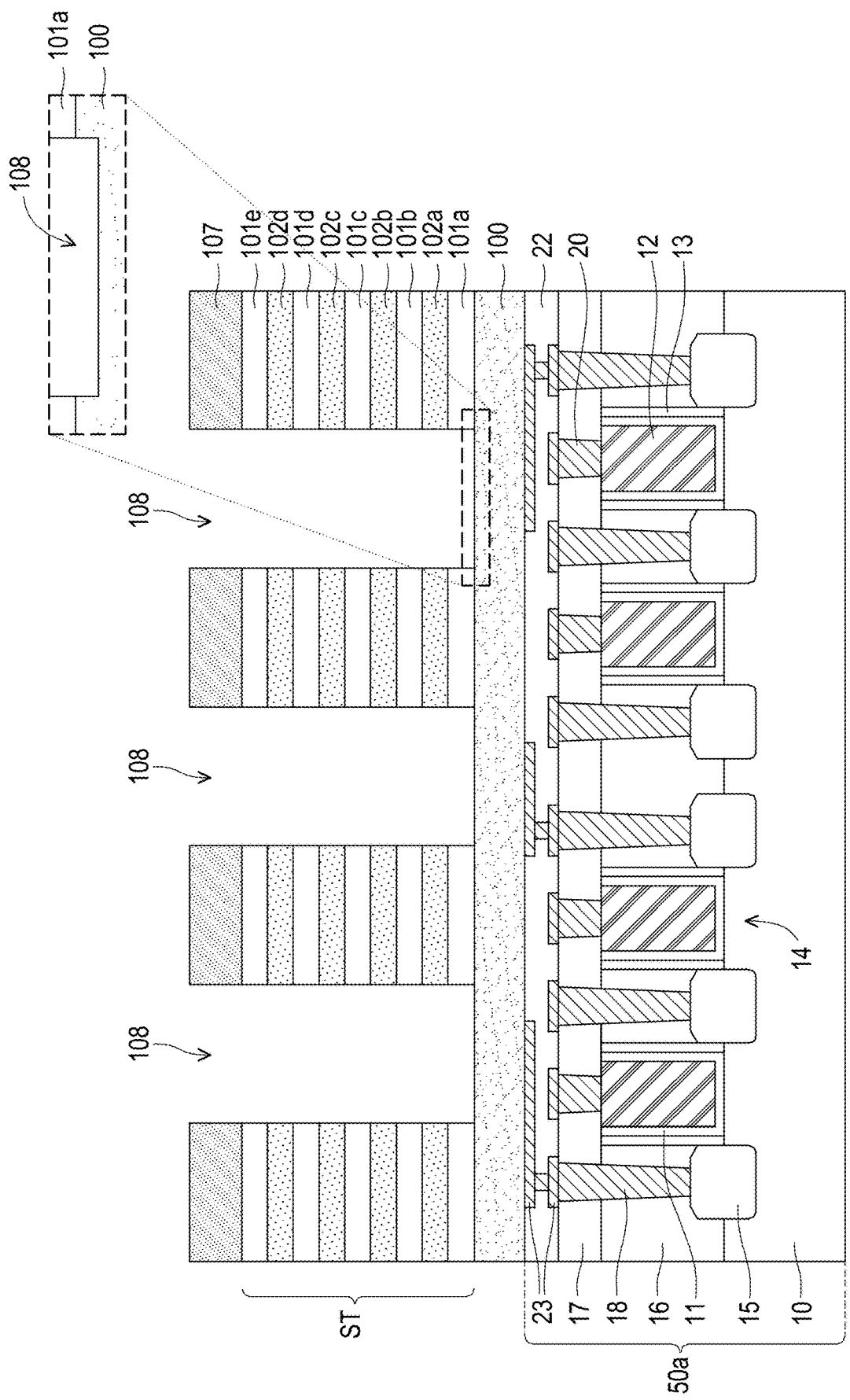

Referring to FIG. 5A and FIG. 5B, in some embodiments, the stack structure ST and the dielectric layer 105 are patterned to form a plurality of trenches 108. The patterning method may include photolithography and etching processes. For example, a patterned mask layer 107 is formed on the stack structure ST and the dielectric layer 105 to cover portions of the top surfaces of the stack structure ST and the dielectric layer 105. The patterned mask layer 107 may include a patterned photoresist, which may be formed by forming a photoresist layer and patterning the photoresist layer by photolithography. The patterned mask layer 107 may include a plurality of patterns extending along a direction D1 and spaced apart from each other along a direction D2. The direction D2 may be substantially perpendicular to the direction D1, and the directions D1 and D2 are parallel with a top surface of the interlayer structure 100 or a top surface of the circuit structure 50a. The patterns of the mask layer 107 may also be referred to as line-and-space pattern. In other words, the patterned mask layer 107 has a plurality of opening extending along the direction D1 and exposing portions of the top surfaces of the stack structure ST and the dielectric layer 105.

Thereafter, etching processes using the patterned mask layer 107 as an etching mask are performed to remove portions of the stack structure ST and the dielectric layer 105, so as to form the trenches 108. The trenches 108 penetrate through the dielectric layers 101 and sacrificial layers 102 of the stack structure ST and the dielectric layer 105, and expose the interlayer structure 100. In the embodiments, the interlayer structure 100 serve as an etching stop structure of the etching process, and also serve as a protection structure for protecting the underlying circuit structure 50a from being damaged by the etching process.

In some embodiments, the etching process stops when the top surface of the interlayer structure 100 is just exposed, and the interlayer structure 100 is substantially not removed by the etching process. In alternative embodiments, the etching process may also remove portions of the interlayer structure 100, and one or more of the trenches 108 further extend into the interlayer structure 100, as shown in the enlarged view. In some embodiments, the bottom surface of the trench 108 is defined by the interlayer structure 100 and may be substantially level with, or lower than the top surface (e.g., topmost surface) of the interlayer structure 100 contacting the dielectric layer 101a, and is higher than the bottom surface of the interlayer structure 100 that is in contact with the underlying circuit structure 50a. In some embodiments, the depths of the trenches 108 are substantially the same, and the bottom surfaces of the trenches 108 are substantially level with each other, but the disclosure is not limited thereto. In some other embodiments, the depths of the trenches 108 may slightly vary. For example, some of the trenches 108 may not extend into the interlayer structure 100 and have bottom surfaces that are substantially level with the bottom surface of the dielectric layer 101a or the topmost surface of the interlayer structure 100, while some of the trenches 108 may further extend into the interlayer structure 100 and have bottom surfaces that are lower than the bottom surface of the dielectric layer 101a.

Figure 5C:
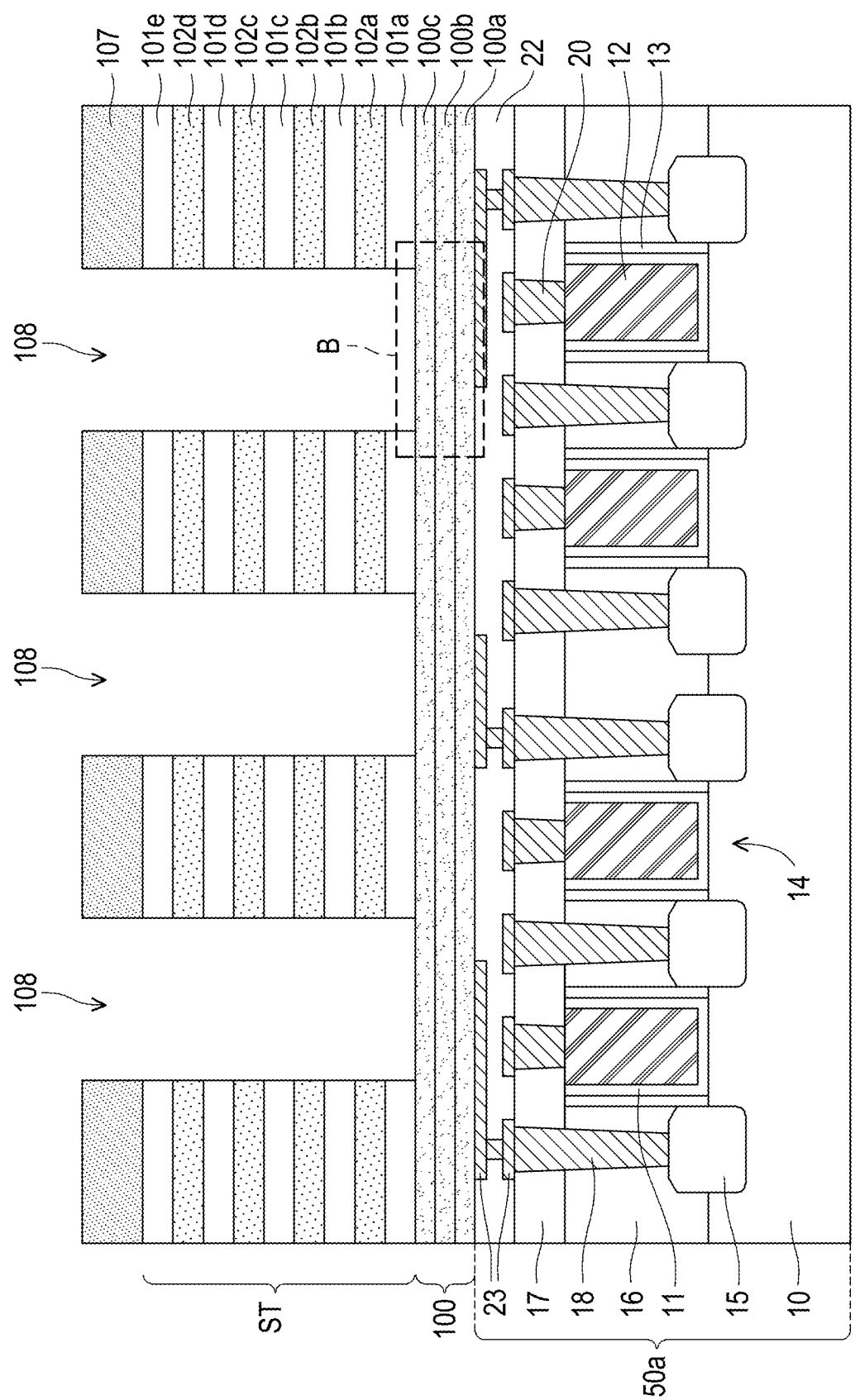

FIG. 5C illustrates an alternative embodiment of FIG. 5B. Referring to FIG. 5C, in some embodiments in which the interlayer structure 100 includes a plurality of interlayers (e.g., the interlayers 100a-100c), the etching process may substantially not remove the interlayer structure 100, and the trench 108 may expose the top surface of the interlayer 100c. The bottom surface of the trench 108 may be defined by the interlayer 100c and may be substantially level with the bottom surface of the dielectric layer 101a or the topmost surface of the interlayer 100c contacting the dielectric layer 101a. However, the disclosure is not limited thereto.

FIG. 5D to FIG. 5H schematically illustrate enlarged views of the region B in FIG. 5C, in accordance with some embodiments of the disclosure. In some embodiments, the etching process for forming the trench 108 may remove portions of the interlayer structure 100 (e.g., one or more of the interlayers 100a-100c), and the etching process may stop at any acceptable point in the interlayer structure 100. For example, referring to FIG. 5D, in some embodiments, the etching process may remove a portion of the topmost interlayer (e.g., interlayer 100c) and stop at a point in the topmost interlayer (e.g., interlayer 100c). As such, the trench 108 extends into the interlayer 100c and has a bottom surface at a level height higher than the bottom surface of the interlayer 100c and lower than the topmost surface of the interlayer 100c (or the bottom surface of the dielectric layer 101a).

Referring to FIG. 5E, in some embodiments, the etching process may remove a portion of the topmost interlayer (e.g., interlayer 100c) and stop on the interlayer 100b, such as stop when the top surface of the interlayer 100b is just exposed, and the interlayer 100b may be substantially not removed. As such, the trench 108 extends into the interlayer 100c and has a bottom surface substantially level with the bottom surface of the interlayer 100c.

Referring to FIG. 5F, in some embodiments, the etching process may remove a portion of the interlayer 100c and a portion of the interlayer 100b, and may stop in the interlayer 100b. The trench 108 may extend into the interlayers 100c and 100b, and the bottom surface of the trench 108 is defined by interlayer 100b, and may be at a level height lower than the topmost surface of the interlayer 100b contacting the interlayer 100c and higher than the bottom surface of the interlayer 100b.

Referring to FIG. 5G, in some embodiments, the etching process may remove portions of the interlayers 100c and 100b, and stop on the interlayer 100a, such as stop when the top surface of the interlayer 100a is just exposed, and the interlayer 100a may be substantially not removed. The trench 108 extends into the interlayers 100c and 100b and has a bottom surface defined by the interlayer 100a. The bottom surface of the trench 108 may be substantially level with the bottom surface of the interlayer 100b.

Referring to FIG. 5H, in some embodiments, the etching process may remove portions of the interlayers 100c and 100b and may further remove a portion of the interlayer 100a. The trench 108 may extend into the interlayers 100c, 100b and 100a, and have a bottom surface at a level height lower than the topmost surface of the interlayer 100a contacting the interlayer 100b and higher than the bottom surface of the interlayer 100a. In various embodiments of the disclosure, the bottom surfaces of the trenches 108 are higher than the top surfaces of the dielectric layer 22 and conductive features 23 of the circuit structure 50a, and at least a portion of the interlayer structure 100 is disposed between the trench 108 and the circuit structure 50a.

In the embodiments of the disclosure, the trenches 108 may have bottom surfaces substantially level with each other, but the disclosure is not limited thereto. In some embodiments, the trenches 108 may have bottom surfaces at level heights that may slightly shift from each other in vertical direction, and the trenches 108 may respectively have a configuration shown in one of FIG. 5C to FIG. 5H.

Referring to FIG. 5A and FIG. 5B to FIG. 6A and FIG. 6B, in some embodiments, a replacement process is performed to replace the sacrificial layers 102a-102d with conductive layers 109a-109d. The mask layer 107 may be removed before or after the replacement process is performed. The conductive layers 109a-109d may be collectively referred to as conductive layers or conductive lines 109. In some embodiments, the replacement of the sacrificial layers 102 may include the following processes. After the trenches 108 are formed extending through the stack structure ST, sidewalls of the sacrificial layers 102 are exposed by the trenches 108, and the sacrificial layers 102 are then removed by an etching process, such as wet etching, dry etching, or a combination thereof. The etching process may be isotropic. The etching process has a high selectivity ratio of the sacrificial layers 102 to the dielectric layers 101, the dielectric layer 105 and the interlayer structure 100. During the etching process for removing the sacrificial layers 102, the interlayer structure 100 serve as a protection structure for protecting the underlying circuit structure 50a from being damaged by the etching process. The interlayer structure 100 may be substantially not removed during the etching process. In some embodiments, the interlayer structure 100 may be slighted damaged, but still have sufficient thickness for protecting the underlying circuit structure 50a. The dielectric layer 22 having conductive features (e.g., conductive lines) 23 embedded therein keeps being covered by the interlayer structure 100, without being exposed by the trenches 108.

The removal of the sacrificial layers 102 forms cavities (not shown) between the dielectric layers 101. The cavities are in spatial communication with the trenches 108. It is noted that, portions of the sacrificial layers 102 in periphery region (not shown) may be not removed, and supporting structures may be formed within the periphery region, such that the remained sacrificial layers 102, the supporting structures as well as the dielectric layer 105 may provide support to prevent the dielectric layers 101 from being collapsed. Thereafter, a conductive material is formed to fill into the cavities between the dielectric layers 101. The conductive layers 109 may include metal, metal nitride or metal alloy, such as copper, titanium, titanium nitride, tantalum, tantalum nitride, tungsten, ruthenium, aluminum, alloys thereof, or the like, or combinations thereof.

The formation of the conductive layers 109 may include depositing a conductive material over the interlayer structure 100 and the stack structure ST by a suitable deposition process, such as ALD, CVD, physical vapor deposition (PVD), PECVD, or the like, or combinations thereof, the conductive material may cover the top surface of the stack structure ST and fill into the trenches 108 and the cavities. Thereafter, portions of the conductive material outside the cavities (i.e., on the top surface of the stack structure ST and in the trenches 108) are removed, remaining the conductive material in the cavities between the dielectric layers 101 to form the conductive layers 109. The removal of the conductive material may include an etching process, such as a dry etching process. In some embodiments, the etching process is anisotropic, the conductive material in the cavities may be substantially not removed during the etching process. In some embodiments, the sidewalls of the conductive layers 109 are substantially aligned with sidewalls of the dielectric layers 101. However, the disclosure is not limited thereto.

In some embodiments, portions of the conductive materials in the cavities may be slightly removed during the removal of the conductive materials in the trenches 108, such that one or more of the conductive layers 109 may be laterally recessed with respect to the sidewalls of the dielectric layers 101, as shown in the enlarged views E1 and E2. In some embodiments, as shown in the enlarged view E1, the recessed sidewall of the conductive layer 109 may be substantially straight, and a recess R1 may be formed and defined by the recessed sidewall of the conductive layer 109 and portions of the top surface and bottom surface of adjacent dielectric layers 101. In some alternative embodiments, as shown in the enlarged view E2, the recessed sidewall of conductive layer 109 may be arced, and a recess R2 may be defined by recessed sidewall of the conductive layer 109, while the bottom surface of overlying dielectric layer 101 and/or the top surface of the underlying dielectric layer 101 may be not exposed by the recess R2.

In some embodiments, one or more of the conductive layers 109 are laterally recessed, and the recessed sidewalls of the conductive layers 109 may or may not be aligned with each other, while the other one or more of the conductive layers 109 may be not recessed and have sidewalls substantially aligned with sidewalls of the dielectric layers 101. In some embodiments, the recessed amount of upper conductive layer 109 is larger than the recessed amount of lower conductive layer 109, and the recess defined by recessed sidewall of upper conductive layer 109 and/or adjacent dielectric layers 101 may be wider than the recess defined by recessed sidewall of lower conductive layer 109 and/or adjacent dielectric layer 101. This may be occurred because that the amount of etching gas may decrease as the depth of the trenches 108 that the etching gas reaches increases. For example, the upper conductive layer 109 (e.g., the conductive layer 109d) may be laterally recessed from sidewalls of the dielectric layers 101, while the lower conductive layer 109 (e.g., the conductive layer 109a) may be less recessed, or may not be recessed and have sidewalls substantially aligned with the sidewalls of the dielectric layers 101.

Figure 7A:
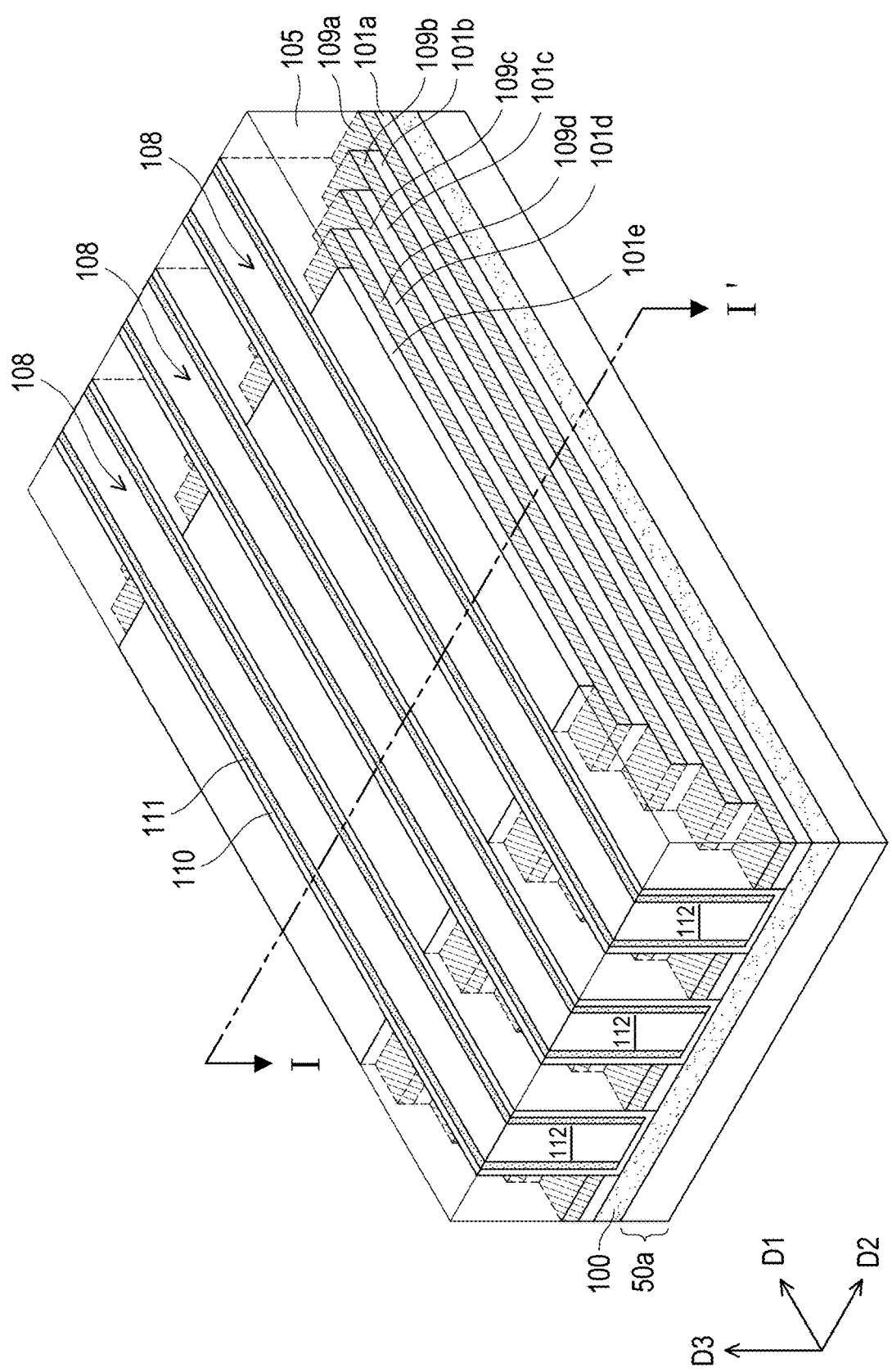
Figure 7B:
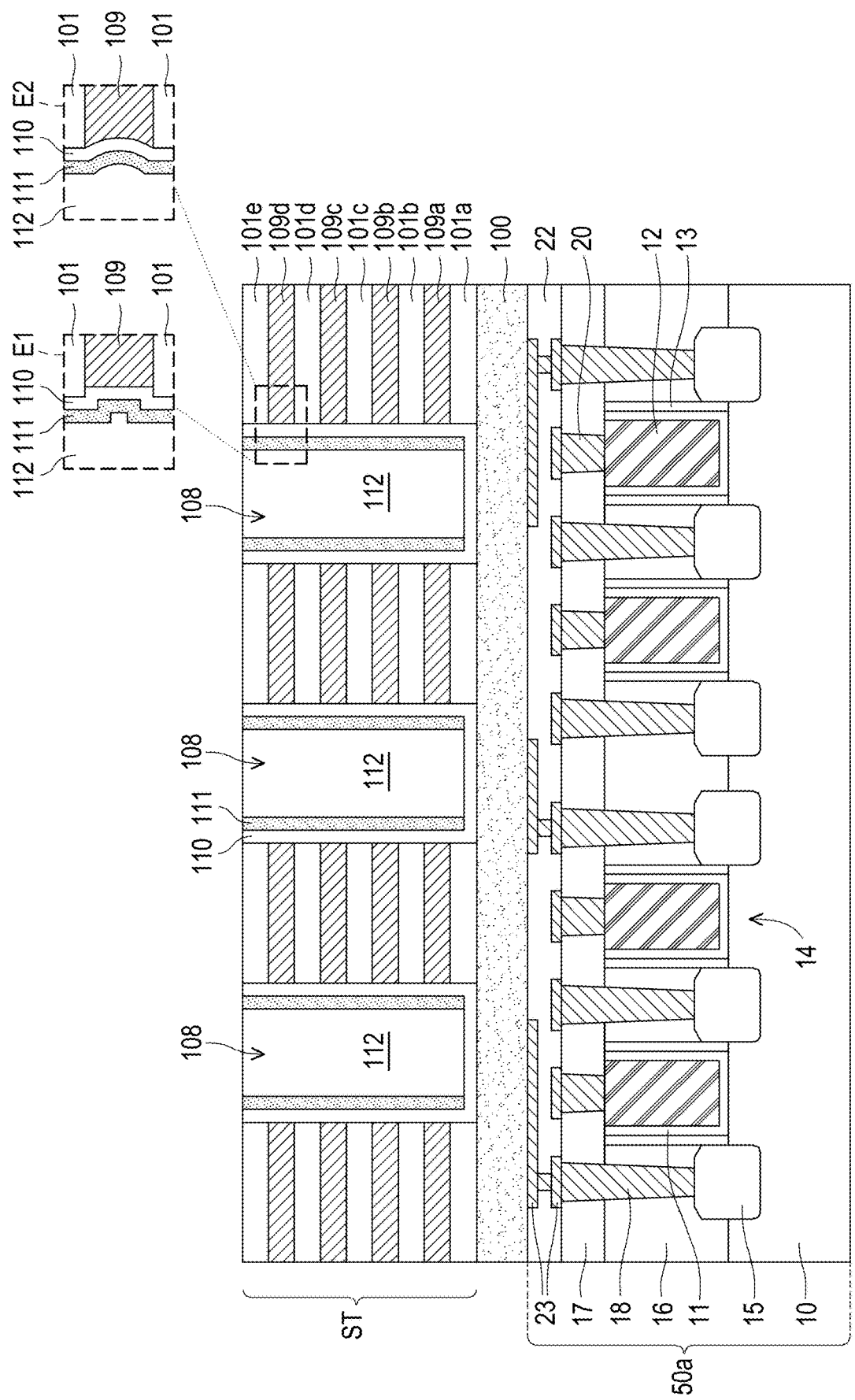

Referring to FIG. 7A and FIG. 7B, in some embodiments, data storage layers 110, channel layers 111, and dielectric layers 112 are formed in the trenches 108. The data storage layer 110 may line (e.g., conformally line) surfaces of the trenches 108 and cover sidewalls of the dielectric layers 101 and conductive layers 109 of the stack structure ST. In some embodiments, the data storage layer 110 covers a portion of the top surface of the interlayer structure 100.

The data storage layer 110 may include an acceptable material for storing digital values and also serving as gate dielectric, for example. In some embodiments, the data storage layer 110 is formed of a ferroelectric material, such as hafnium zirconium oxide (HfZrO); zirconium oxide (ZrO); hafnium oxide (HfO) doped with lanthanum (La), silicon (Si), aluminum (Al), or the like; undoped hafnium oxide (HfO); or the like. In some alternative embodiments, the data storage layer 110 may include charge trapping layers. The charge trapping layers may include oxide-nitride-oxide (ONO) layers (e.g., a silicon nitride layer sandwiched between two silicon oxide layers). In some embodiments, the data storage layer 110 may be formed by forming a data storage material over the interlayer structure 100 to cover the top surface of the stack structure ST and surfaces of the trench 108, through a suitable deposition process, such as CVD, atomic layer deposition (ALD), or the like. Thereafter, excess portions of the data storage material over the top surface of the stack structure ST may be removed by, for example, a planarization process, such as a CMP process. In alterative embodiments, the excess portions of the data storage material are not removed immediately after being deposited, and may be removed simultaneously with the formation of the dielectric layer 112.

The channel layers 111 are formed on sidewalls of the data storage layer 110. In some embodiments, the channel layers 111 within a same trench 108 are disposed on opposite inner sidewalls of the data storage layer 110 and are separated from each other. The channel layer 111 includes a material (e.g., semiconductor material) suitable for providing a channel region for a transistor. In some embodiments, the channel layer 111 may include a metal oxide, oxide semiconductor, or a combination thereof. For example, the channel layer 111 may include indium gallium zinc oxide (IGZO), indium tin oxide (ITO), indium gallium zinc tin oxide (IGZTO), zinc oxide (ZnO), polysilicon, amorphous silicon, or the like.

Figure 6A:
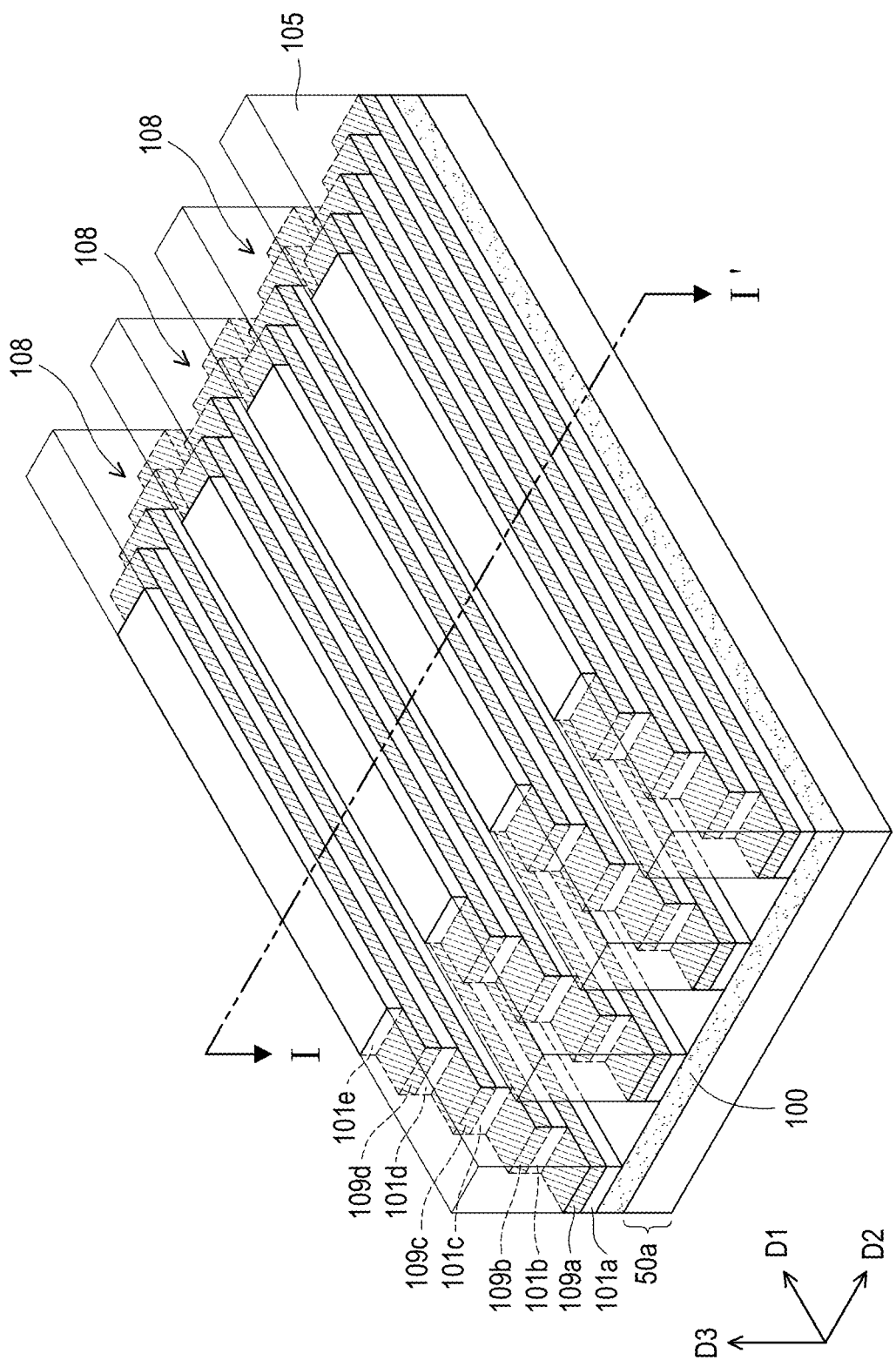
Figure 6B:
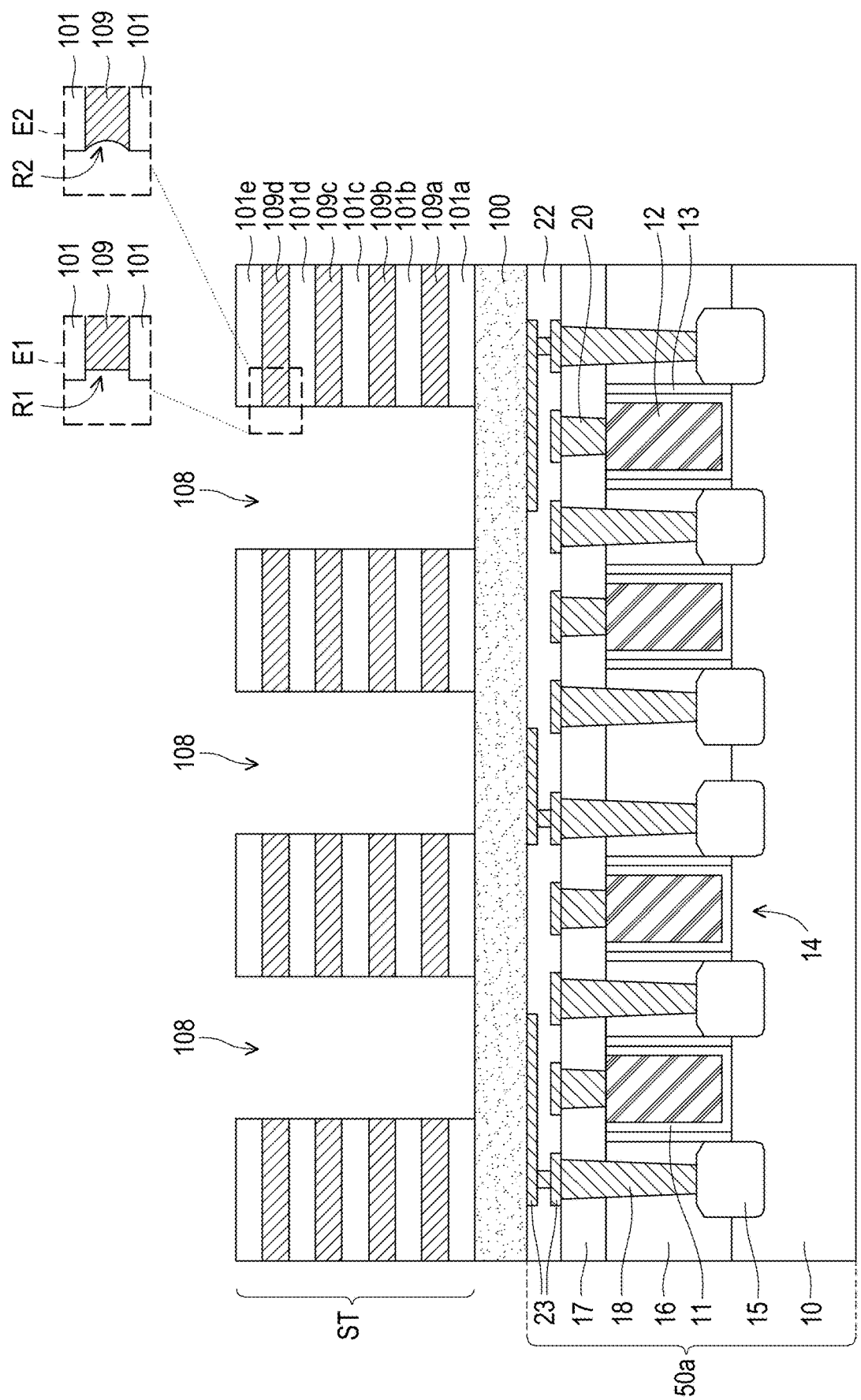

In some embodiments, the formation of the channel layers 111 may include forming a channel material layer over the interlayer 100 and the stack structure ST to fill into the trenches 108 and lining surfaces of the data storage layer 110. Thereafter, excess portions of the channel material layer over the top surface of the stack structure ST and portions of the channel material layer at the bottom of the trenches 108 are removed by an etching back process, or photolithograph and etching processes. In some embodiments, the horizontal portion of the channel material layer covering the horizontal bottom portion of the data storage layer 110 may be completely removed, remaining vertical portions of the channel material layer on sidewalls of the data storage layer 110 to form the channel layers 111, as shown in FIG. 6B. However, the disclosure is not limited thereto. In some alternative embodiments, the horizontal portion of the channel material layer may be partially removed, such that parts of the horizontal portion of the channel material layer are separated from each other and remained to form the channel layers 111, which may be L-shaped or the like.

Still referring to FIG. 7A and FIG. 7B, dielectric layers 112 are formed to fill the remaining portions of the trenches 108. The dielectric layers 112 may include oxides such as silicon oxide or aluminum oxide; nitrides such as silicon nitride; carbides such as silicon carbide; silicon oxynitride, silicon oxycarbide, silicon carbonitride, silicon oxycarbonitride, or the like, or combinations thereof. The dielectric layers 112 may be formed by forming a dielectric material over the interlayer structure 100 and the stack structure ST through an acceptable deposition process such as ALD, CVD, flowable CVD (FCVD), or the like. The dielectric material fills the remaining portions of the trenches 108 and cover the top surface of the stack structure ST. Thereafter, a planarization process (e.g., CMP) is performed to remove excess portions of the dielectric material over the top surfaces of the stack structure ST. In some embodiments in which excess portions of the data storage material are not removed before forming the channel layers 111, the planarization process may further remove excess portions of the data storage material over the top surface of the stack structure ST. In some embodiments, the top surfaces of the data storage layers 111, the channel layers 111, and the dielectric layers 112 are substantially level with the top surface of the stack structure ST.

In some embodiments in which one or more of the conductive layers 109 are laterally recessed, the data storage layer 110, and/or the channel layer 111 and/or the dielectric layer 112 may fill into the recess R1 or R2, as shown in the enlarged views. The bottom surface of the data storage layer 110 is disposed on and in contact with the top surface of the interlayer structure 100. In some embodiments, the bottom surface of the data storage layer 110 is substantially level with the bottom surface of the dielectric layer 101a. In some embodiments in which the trench 108 extends into the interlayer structure 100, the data storage layer 110 and/or the channel layers 111 and the dielectric layer 112 may further extend into the interlayer structure 100 and have portions embedded in the interlayer structure 100. In such embodiments, the bottom surface of the data storage layer 110 may be lower than the bottom surface of the dielectric layer 101a or the topmost surface of the interlayer structure 100, and the sidewalls and bottom surface of a bottom portion of the data storage layer 110 may be covered by the interlayer structure 100. The bottom surfaces of the channel layers 111 and the dielectric layer 112 may be higher than, substantially level with, or lower than the bottom surface of the dielectric layer 101a (i.e., the bottommost surface of the stack structure ST) or the topmost surface of the interlayer structure 100.

Figure 7C:
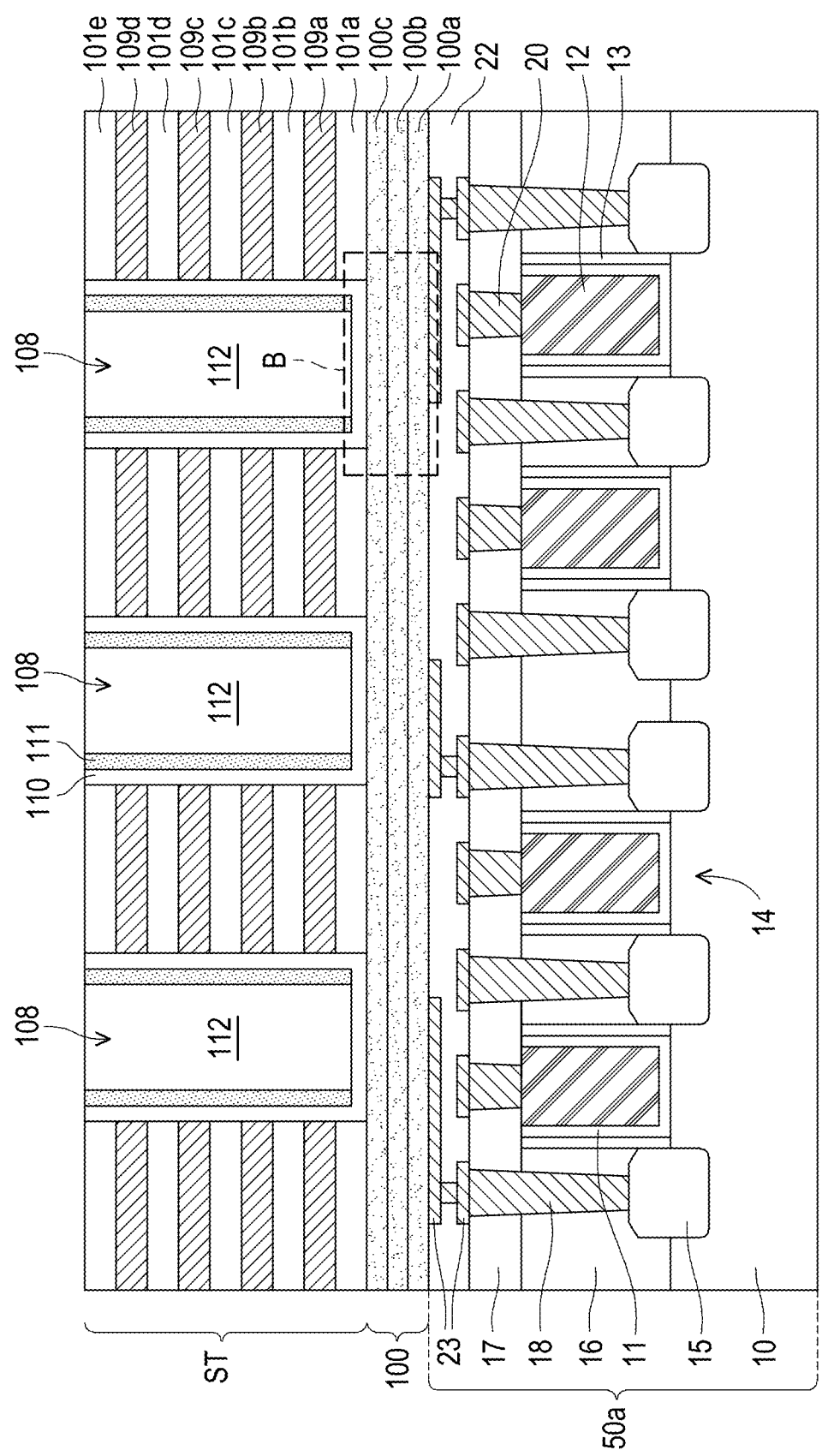
Figure 7D:
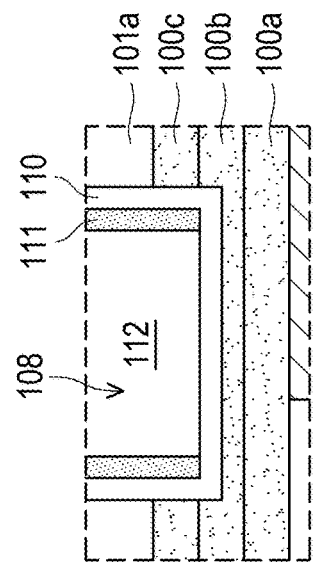
Figure 7E:
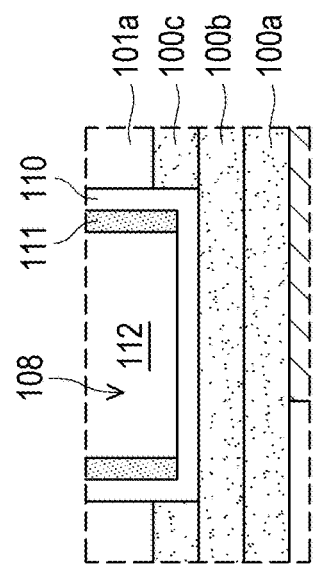
Figure 7F:
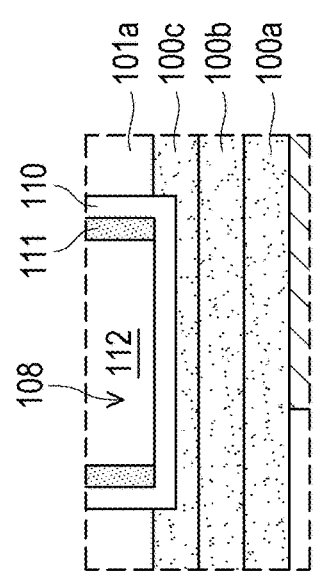
Figure 7G:
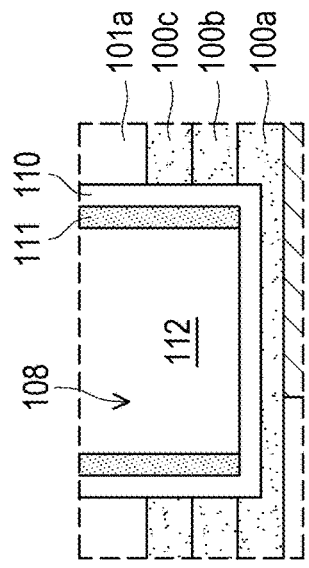
Figure 7H:
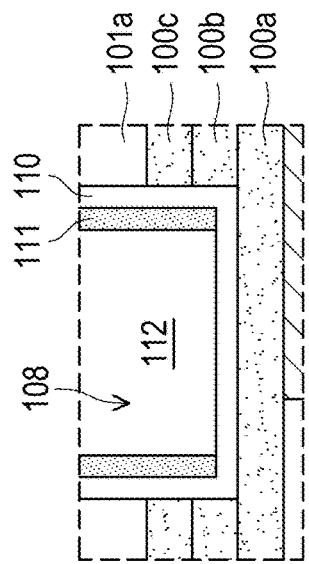

FIG. 7C illustrate the alternative embodiment of FIG. 7B. Referring to FIG. 7C, in some embodiments in which the interlayer structure 100 is a multi-layer structure, the bottom surface of the data storage layer 110 may be disposed on and in contact with the top surface of the interlayer 100c, and may be substantially level with the bottom surface of the dielectric layer 101a or the topmost surface of the interlayer 100c contacting the dielectric layer 101a. However, the disclosure is not limited thereto.

FIG. 7D to FIG. 7H illustrate enlarged views of the region B in FIG. 7B according to some alternative embodiments of the disclosure, in which the trench 108 extends into the interlayer structure 100. Referring to FIG. 7C and FIG. 7D to FIG. 7H, in some embodiments, the bottom surface of the data storage layer 110 may be in contact with the interlayer 100c, the interlayer 100b or the interlayer 100a, and may be located at any suitable level height vertically between the bottommost surface and the topmost surface of the interlayer structure 100. The sidewalls of the bottom portion of the data storage layer 110 may be covered by one or more of the interlayers 100a-100c. In various embodiments of the disclosure, the data storage layer 110 is separated from the underlying dielectric layer 22 and conductive features 23 of the circuit structure 50a by at least a portion of the interlayer structure 100.

Figure 8A:
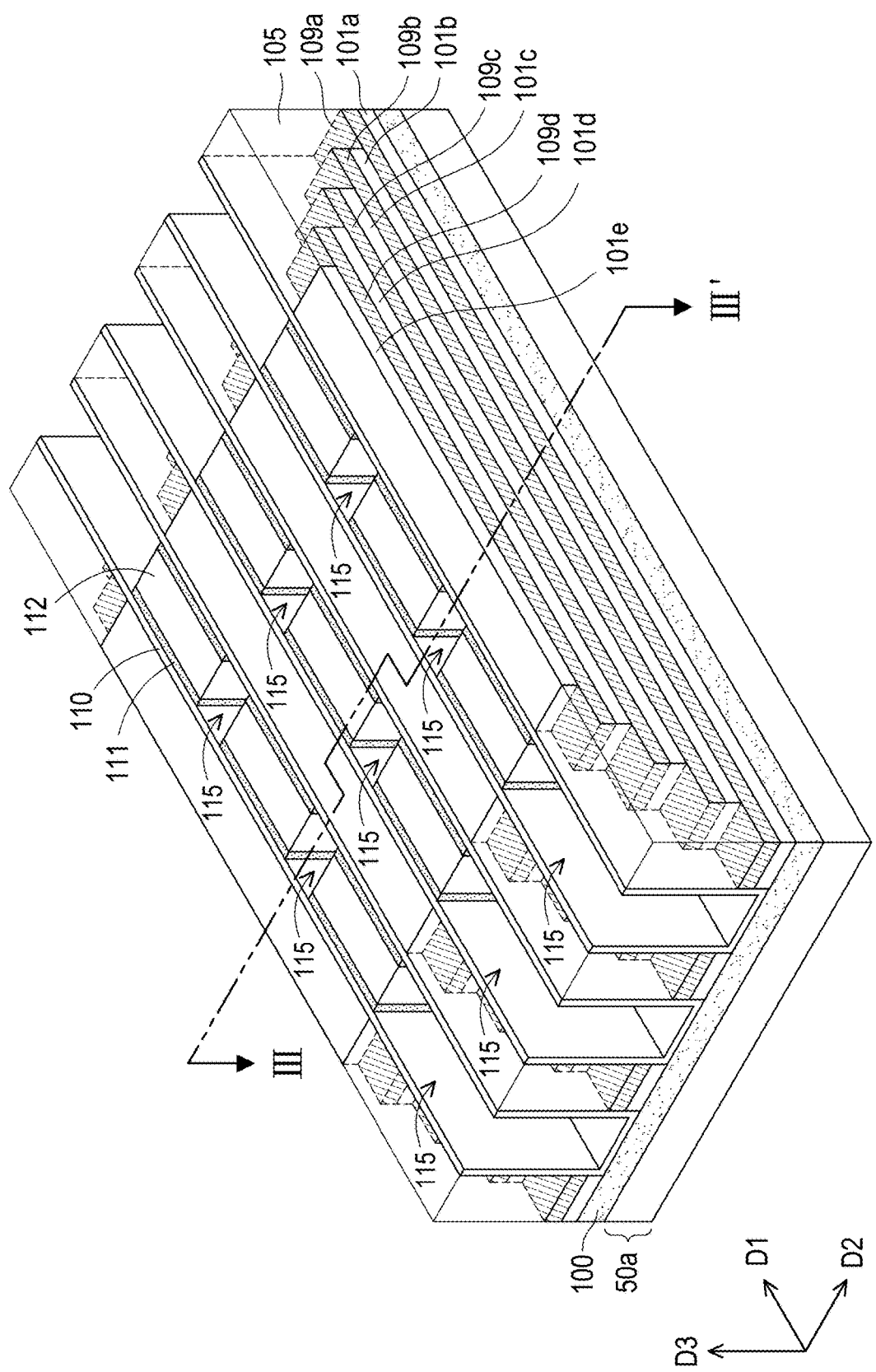
Figure 8B:
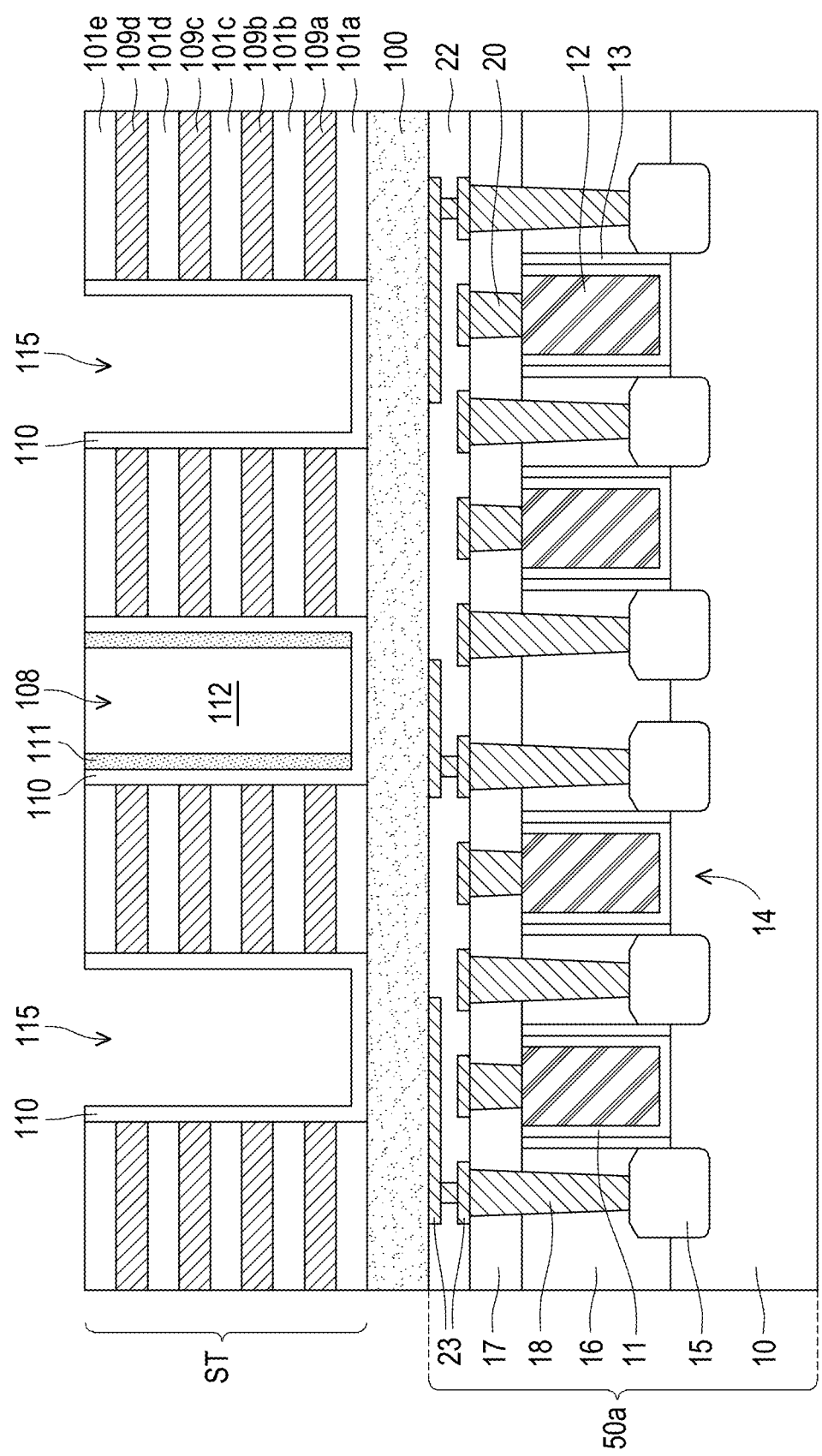
Figure 8C:
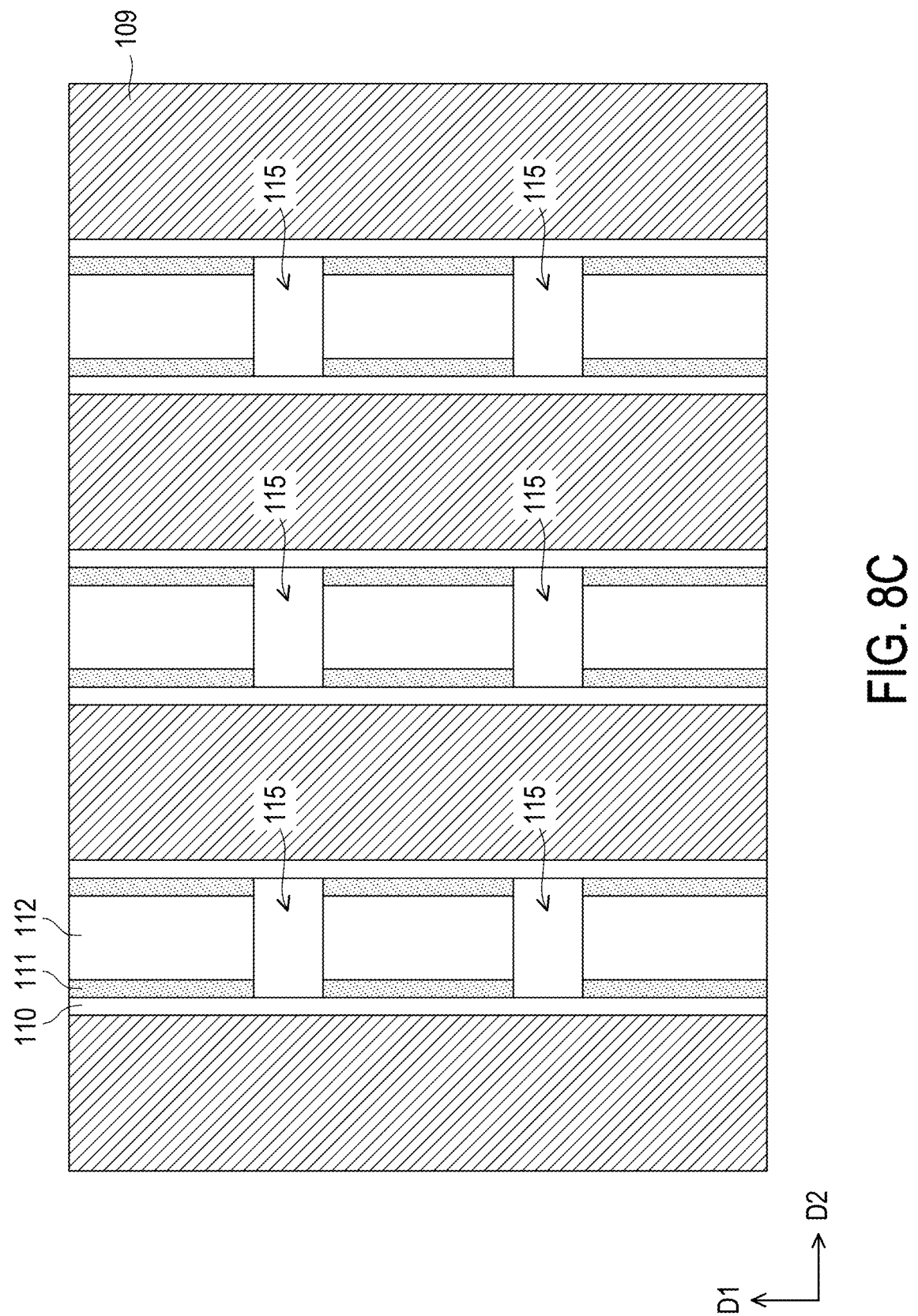

Referring to FIG. 8A to FIG. 8C, FIG. 8B illustrate a cross-sectional view taken along line III-III' of FIG. 8A, FIG. 8C illustrates a plan view along a plane including a top surface of one of the conductive layers 109. In some embodiments, the channel layers 111 and the dielectric layers 112 are patterned to form openings 115 through the channel layers 111 and the dielectric layers 112. Patterning the openings 115 may be performed through photolithography and etching processes, for example. The openings 115 may be disposed between opposing sidewalls of the data storage layer 110, and the openings 115 may physically separate adjacent to-be-formed memory cells. In some embodiments, the opening 115 penetrates through the channel layers 111 and the dielectric layer 112 to expose a portion of the top surface of horizontal portion of the data storage layer 110. However, the disclosure is not limited thereto. In some alternative embodiments, the opening 115 may further penetrate through the data storage layer 110 and expose a portion of the top surface of the interlayer structure 100. As shown in FIG. 8A and FIG. 8C, in some embodiments, the openings 115 may be arranged in an array, and may be aligned with each other along the directions D1 and D2, but the disclosure is not limited thereto. In some other embodiments, adjacent openings 115 along the direction D2 may be staggered.

Referring to FIG. 9A to FIG. 9C, isolation structures 116 are formed in the openings 115. The isolation structures 116 may include an acceptable insulating material for electrically isolating adjacent memory cells. For example, the isolation structure 116 may include silicon oxide, silicon nitride, silicon oxynitride, or the like, or combinations thereof. In some embodiments, materials of the isolation structure 116 and the dielectric layers 112 are formed of different material, such that they may be etched selectively relative to each other. For example, in some embodiments, the dielectric layers 112 includes an oxide and the isolation structures 116 includes a nitride, but the disclosure is not limited thereto. Other acceptable materials may also be used. In some embodiments, the isolation structures 116 may be formed by forming an isolation material over the interlayer structure 100 and the stack structure ST to fill the openings 115 and cover top surfaces of the stack structure ST, through a suitable deposition process, such as CVD, PECVD, FCVD, or the like. Thereafter, a planarization process (e.g., CMP, etch back, or the like) may be performed to remove excess portions of the isolation material over the top surfaces of the stack structure ST. In some embodiments, the top surfaces of the isolation structures 116 are substantially level with the top surfaces of the stack structure ST, the data storage layer 110 and the channel layer 111 (e.g., within process variations).

Referring to FIG. 10A to FIG. 10C, conductive pillars 118a and 118b (collectively referred to as conductive pillars 118) are formed in and penetrating through the dielectric layers 112. The formation of the conductive pillars 118 may include the following processes. In some embodiments, the dielectric layers 112 are patterned to form openings 117 therein by photolithography and etching processes, for example. The etching process may be anisotropic. In some embodiments, the etching process has a high etching selectivity ratio of the dielectric layers 112 to the isolation structures 116, and the isolation structure 116 are substantially not removed during the etching process. In some embodiments, the openings 117 extend through the dielectric layer 112 and may expose the top surfaces of horizontal portions of the data storage layers 110.

Thereafter, conductive materials are formed over the stack structure ST to fill in the openings 117. In some embodiments, the conductive material may include copper, titanium, titanium nitride, tantalum, tantalum nitride, tungsten, ruthenium, aluminum, combinations thereof, or the like, and may be formed by, for example, CVD, ALD, PVD, PECVD, or the like. The conductive material may fill in the openings 117 and cover the top surfaces of the stack structure ST. Thereafter, a planarization process may be performed to remove excess portions of the conductive material over the top surfaces of the stack structure ST. As such, the conductive materials remained in the openings 117 form the conductive pillars 118. In some embodiments, the top surfaces of the conductive pillars 118 are substantially level with the top surfaces of the stack structure ST. The conductive pillars 118 includes pairs of conductive pillars 118a and 118b that are isolated from each other by the isolation structures 116. Each pair of the conductive pillars 118a and 118b are separated from each other by the dielectric layer 112 therebetween.

In some embodiments, the bottom surfaces of the conductive pillars 118 may be substantially level with the bottom surfaces of the isolation structures 116 and/or the bottom surfaces of the dielectric layers 112. The bottom surfaces of the conductive pillars 118 and the isolation structures 116 may be higher than the bottom surface of the dielectric layer 101a, but the disclosure is not limited thereto. As shown in the enlarged view, in some other embodiments in which the trench 108 further extends into the interlayer structure 100, the bottom surfaces of the conductive pillars 118 and/or the isolation structures 116 may be level with or lower than the bottom surface of the dielectric layer 101a, and may be located at any suitable level height between the bottommost surface and the topmost surface of the interlayer structure 100, which is similar to the level height of bottom surfaces of the dielectric layers 112 shown in FIG. 7D to FIG. 7H.

Referring to FIG. 10A to FIG. 10C, as such, a memory structure 200 is thus formed. In some embodiments, a portion of respective conductive layer 109, portions of corresponding pair of the conductive pillars 118a and 118c, and portions of the data storage layer 110 and the channel layer 111 disposed between the said portions of the conductive layer 109 and the conductive pillars 118a and 118b constitute a memory cell 160. A plurality of memory cells 160 may be arranged in an array. Adjacent memory cells 160 along the direction D1 may be separated from each other by the isolation structures 116. In some embodiments, the conductive layers 109 serve as word lines of the memory structure 200. The conductive pillars 118a and 118b serve as source lines and bit lines, or vice versa. The detailed description of the memory structure 200 may be referred to those described with respect to FIG. 1A and FIG. 1B, and are not described again here.

Referring to FIG. 11A, in some embodiments, conductive contacts 120 are formed on the conductive pillars 118, and conductive lines 121 are formed to on the conductive contacts 120 and electrically connected to the conductive pillars 118 through the conductive contacts 120. Conductive contacts 122 are formed to be electrically connected to the conductive lines 109, and conductive lines 125 may be formed on the conductive contacts 122 and configured for connecting the memory structure 200 to the underlying circuit structure 50a.

Referring to FIG. 11A and FIG. 11B, in some embodiments, the conductive contacts 122 penetrate through the dielectric layer 105 and land on (e.g., protruding portions of) the conductive lines 109 at the staircase region. In some embodiments, a dielectric layer 124 may be formed over the dielectric layer 105, and the contacts 122 penetrates through the dielectric layer 124 and the dielectric layer 105 to connect to the conductive lines 109.

In some embodiments, conductive contacts 123 penetrate through the memory structure 200 and the interlayer structure 100 to be electrically connected to the underlying circuit structure 50a. For example, the conductive contact 123 may penetrate through the dielectric layer 124, the isolation structure 116 and the data storage layer 110 of the memory structure 200 and the interlayer structure 100 to be electrically connected to the conductive feature (e.g., conductive line) 23 of the circuit structure 50a. The conductive lines 125 are formed on the conductive contacts 123 and the conductive contacts 122, such that the conductive lines 109 of the memory structure 200 are electrically connected to the circuit structure 50a through the conductive contacts 122, 123 and the conductive lines 125.

Referring to FIG. 11B, in some embodiments, portions of the conductive contacts 123 are embedded in and surrounded by the interlayer structure 100. There may be free of other conductive features (e.g., interconnect layer including conductive lines and/or conductive vias) in the interlayer structure 100 other than the conductive contacts 123 and/or the protruding portions of the conductive pillars 118. The bottom surface of the conductive contact 123 is lower than the bottommost surface of the stack structure ST (e.g., the bottom surface of the dielectric layer 101a), lower than the bottommost surface of the memory structure 200, and may be substantially level with or lower than the bottommost surface of the interlayer structure 100.

Figure 12:
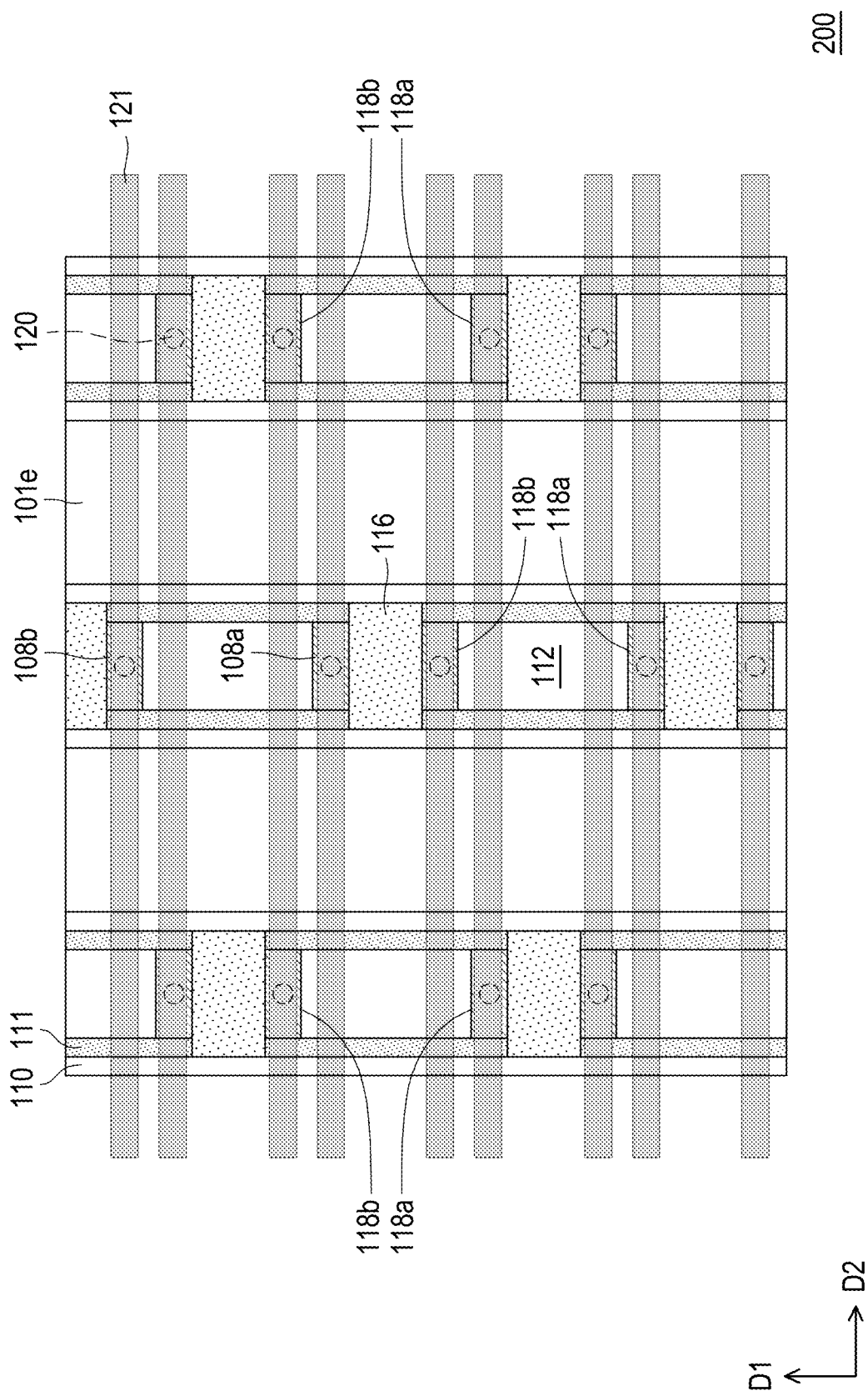
FIG. 12 illustrates a top view of a semiconductor structure according to some embodiments of the disclosure.

In the embodiments shown in FIG. 2A through FIG. 11B, the adjacent conductive pillars 118 in a row may be aligned with each other along the direction D2. However, the disclosure is not limited thereto. In some embodiments, as shown in the embodiments of FIG. 1A and FIG. 12, in some embodiments, the adjacent conductive pillars 118 along the direction D2 may be staggered.

In some embodiments, after the semiconductor structure including the circuit structure 50a, the interlayer structure 100, and the memory structure 200 is formed, further processes may be performed to complete the formation of a semiconductor die. The further processes may include, for example, forming additional dielectric layers and/or interconnect layers, forming passivation layers, forming conductive pads and/or connectors, or combinations thereof.

In the embodiments of the disclosure, the memory structure and logic circuit are integrated in a 3D structure within a single semiconductor die, the memory structure is formed in BEOL and disposed over the logic circuit. As such, the footprint for the memory structure and the logic circuit is reduced. In addition, an interlayer structure is disposed vertically between the logic circuit and the memory structure, which may protect the underlying logic circuit from being damaged during the formation of the memory structure. The connection between the memory structure and logic circuit is achieved by conductive lines and conducive vias directly through the memory structure and the interlayer structure within the semiconductor die. Therefore, comparing to the conventional configuration where memory device and logic circuit are integrated in a package structure, the current path between the memory and logic circuit of the disclosure is greatly reduced, and the power consumption is thus reduced and the device performance is improved.

In accordance with some embodiments of the disclosure, a semiconductor structure includes a circuit structure, an interlayer structure and a memory structure. The circuit structure includes a substrate having semiconductor devices formed thereon; a dielectric structure disposed over the semiconductor devices; and an interconnect layer embedded in the dielectric structure and connected to the semiconductor devices. The interlayer structure is disposed over the circuit structure. The memory structure is disposed over the interlayer structure and physically separated from the circuit structure by the interlayer structure.

In accordance with alternative embodiments of the disclosure, a semiconductor structure includes a logic circuit structure, an interlayer structure disposed on the logic circuit structure and a memory structure disposed on the interlayer structure. The memory structure includes a word line extending along a first direction parallel with a top surface of the interlayer structure; a pair of source line and bit line, extending along a second direction perpendicular to the first direction and perpendicular to the top surface of the interlayer structure; and an isolation structure, disposed adjacent to the pair of source line and bit line for isolating adjacent memory cells. A first conductive contact lands on the word line. A second conductive contact penetrates through the isolation structure and the interlayer structure and lands on the conductive feature of the logic circuit structure. A conductive line is electrically connected to the first conductive contact and the second conductive contact.

In accordance with some embodiments of the disclosure, a method of forming a semiconductor structure includes: forming a circuit structure; forming an interlayer structure over the circuit structure; and forming a memory structure over the interlayer structure. Forming the circuit structure includes: providing a substrate having semiconductor devices formed thereon; forming a dielectric structure over the semiconductor devices; and forming an interconnect layer in the dielectric structure and connected to the semiconductor devices. The memory structure is physically separated from the dielectric structure and the interconnect layer of the circuit structure by the interlayer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a logic circuit structure;
an interlayer structure, disposed on the logic circuit structure; and
a memory structure, disposed on the interlayer structure, wherein the memory structure comprises:
a word line, extending along a first direction parallel with a top surface of the interlayer structure;
a pair of source line and bit line, extending along a second direction perpendicular to the first direction and perpendicular to the top surface of the interlayer structure; and
an isolation structure, disposed adjacent to the pair of source line and bit line for isolating adjacent memory cells;
a first conductive contact, landing on the word line;
a second conductive contact, penetrating through the isolation structure and the interlayer structure and landing on a conductive feature of the logic circuit structure; and a conductive line, electrically connected to the first conductive contact and the second conductive contact.

2. The semiconductor structure of claim 1, wherein the memory structure further comprises:
   a channel layer, disposed between the word line and the pair of source line and bit line; and
   a data storage layer, disposed between the word line and the channel layer, and surrounding sidewalls and a bottom surface of the isolation structure,
   wherein the second conductive contact further penetrates through the data storage layer, and at least a portion of the interlayer structure is disposed between the data storage layer and the logic circuit structure.

3. The semiconductor structure of claim 1, wherein the memory structure comprises a stack structure comprising a plurality of dielectric layers and a plurality of word lines alternately stacked on the interlayer structure, and a bottommost dielectric layer of the plurality of dielectric layers is in contact with the interlayer structure.

4. The semiconductor structure of claim 3, wherein bottom surfaces of the pair of source line and bit line are located at a level height vertically between a bottom surface and a top surface of the interlayer structure.

5. The semiconductor structure of claim 1, wherein the interlayer structure is a multilayer structure comprises a plurality of interlayers having different materials.

6. The semiconductor structure of claim 5, wherein the pair of source line and bit line further extend into at least one of the plurality of interlayers.

7. A semiconductor structure, comprising:
   a logic circuit structure, including semiconductor devices and a conductive feature electrically connected with the semiconductor devices formed therein;
   an interlayer structure, disposed on the logic circuit structure; and
   a memory structure disposed on the interlayer structure, wherein the interlayer structure is interposed between the memory structure and the logic circuit substrate, and the memory structure comprises:
     a word line, extending along a first direction parallel with a top surface of the interlayer structure;
     a pair of source line and bit line, extending along a second direction perpendicular to the first direction and perpendicular to the top surface of the interlayer structure; and
     an isolation structure, disposed adjacent to the pair of source line and bit line for isolating adjacent memory cells;
     a first conductive contact, landing on the word line;
     a second conductive contact, penetrating through the isolation structure and the interlayer structure and landing on the conductive feature of the logic circuit structure; and
     a conductive line, electrically connected to the first conductive contact and the second conductive contact.

8. The semiconductor structure of claim 7, wherein the memory structure further comprises:
   a channel layer, disposed between the word line and the pair of source line and bit line; and
   a data storage layer, disposed between the word line and the channel layer, and surrounding sidewalls and a bottom surface of the isolation structure,
   wherein the second conductive contact further penetrates through the data storage layer, and at least a portion of the interlayer structure is disposed between the data storage layer and the circuit structure so that the data storage layer is separated from the logic circuit structure by the interlayer structure.

9. The semiconductor structure of claim 7, wherein the memory structure comprises a stack structure comprising alternately stacked dielectric layers and word lines on the interlayer structure, bottom surfaces of the pair of source line and bit line are higher than a bottom surface of the bottommost dielectric layer.

10. The semiconductor structure of claim 7, wherein the memory structure comprises a stack structure comprising alternately stacked dielectric layers and word lines on the interlayer structure, bottom surfaces of the pair of source line and bit line are substantially levelled with a bottom surface of the bottommost dielectric layer.

11. The semiconductor structure of claim 7, wherein the memory structure comprises a stack structure comprising alternately stacked dielectric layers and word lines on the interlayer structure, bottom surfaces of the pair of source line and bit line are lower than a bottom surface of the bottommost dielectric layer.

* * * * *